(12) United States Patent
Kataoka et al.

(10) Patent No.: US 6,876,435 B2
(45) Date of Patent: Apr. 5, 2005

(54) EXPOSURE METHOD, PLANE ALIGNMENT METHOD, EXPOSURE APPARATUS, AND DEVICE MANUFACTURING METHOD

(75) Inventors: Yoshiharu Kataoka, Tochigi (JP); Tai Hoshi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 153 days.

(21) Appl. No.: 10/127,765

(22) Filed: Apr. 23, 2002

(65) Prior Publication Data

US 2002/0166982 A1 Nov. 14, 2002

(30) Foreign Application Priority Data

May 9, 2001 (JP) ........................................ 2001-138367

(51) Int. Cl.⁷ ........................... G03B 27/42; G03B 27/52
(52) U.S. Cl. ........................................ 355/53; 355/55
(58) Field of Search ............................ 355/53, 55, 67, 355/77; 356/399–401; 250/548

(56) References Cited

U.S. PATENT DOCUMENTS

| | | | |
|---|---|---|---|
| 4,748,333 A | | 5/1988 | Mizutani et al. ............ 250/561 |
| 5,243,377 A | * | 9/1993 | Umatate et al. ............. 355/53 |
| 5,323,016 A | | 6/1994 | Yamada et al. ............. 250/561 |
| 5,602,399 A | * | 2/1997 | Mizutani ..................... 250/548 |
| 5,751,428 A | | 5/1998 | Kataoka et al. ............. 356/401 |
| 5,985,495 A | * | 11/1999 | Okumura et al. ............. 430/22 |
| 6,117,598 A | * | 9/2000 | Imai ............................ 430/22 |
| 6,277,533 B1 | * | 8/2001 | Wakamoto et al. ........... 430/30 |
| 6,381,004 B1 | * | 4/2002 | Hagiwara et al. ............. 355/53 |
| 6,399,283 B1 | | 6/2002 | Hoshi ........................ 430/312 |
| 6,400,456 B1 | * | 6/2002 | Miyachi ..................... 356/399 |
| 6,538,721 B2 | * | 3/2003 | Okita et al. .................. 355/53 |
| 6,608,681 B2 | * | 8/2003 | Tanaka et al. .............. 356/400 |

FOREIGN PATENT DOCUMENTS

JP 2-102518 4/1990

* cited by examiner

*Primary Examiner*—Henry Hung Nguyen
(74) *Attorney, Agent, or Firm*—Fitzpatrick, Cella, Harper & Scinto

(57) ABSTRACT

In an exposure system, a predetermined wafer (5) is exposed with the first exposure layout by using a projection optical system (4) for projecting the pattern of a reticle (2) onto the wafer, an illumination device (10) and light-receiving device (11) for detecting a plurality of plane positions on the wafer (5), and a driving unit for driving the wafer (5) along the optical axis of the projection optical system (4). Prior to the second exposure with the second exposure layout at the second exposure field size, a position where a plane position is to be detected is determined on the basis of at least one of the first exposure field size, the first exposure layout, and underlayer information of the first exposure. Then, the plane position is detected.

14 Claims, 26 Drawing Sheets

F I G. 12A
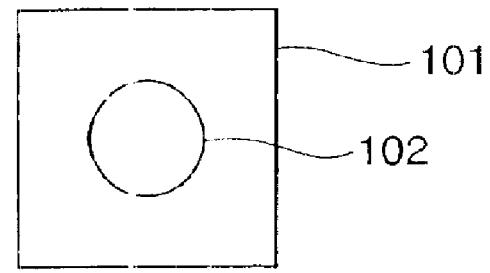
F I G. 12B
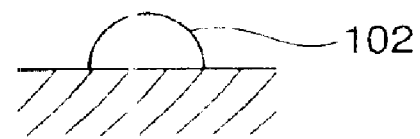

F I G. 24

```
URL  http://www.maintain.co.jp/db/input.html

TROUBLE DB INPUT WINDOW

OCCURRENCE DATE  [2000/3/15] ~1404
TYPE OF APPARATUS [**********] ~1401
OBJECT [OPERATION ERROR (START-UP ERROR)] ~1403
DEVICE S/N  [465NS4580001] ~1402
DEGREE OF URGENCY [D] ~1405
SYMPTOM  [LED KEEPS FLICKERING AFTER
          POWER ON                        ] ~1406

REMEDY   [POWER ON AGAIN
          (PRESS RED BUTTON IN ACTIVATION)] ~1407

PROGRESS [INTERIM HAS BEEN DONE           ] ~1408

[SEND] [RESET]     1410              1411            1412
               LINK TO RESULT LIST DATABASE  SOFTWARE LIBRARY  OPERATION GUIDE
```

SEMICONDUCTOR DEVICE MANUFACTURING FLOW

EXPOSURE METHOD, PLANE ALIGNMENT METHOD, EXPOSURE APPARATUS, AND DEVICE MANUFACTURING METHOD

FIELD OF THE INVENTION

The present invention relates to a plane alignment method, an exposure method, an exposure apparatus, and a device manufacturing method used to manufacture various devices including a semiconductor element such as an IC or LSI, a display element such as a liquid crystal panel, a detection element such as a magnetic head, and an image sensing element such as a CCD.

BACKGROUND OF THE INVENTION

Conventionally, in manufacturing a semiconductor device, exposure apparatuses with different exposure fields are often selectively used for exposure between different layers. For example, so-called mix and match exposure which uses the first exposure apparatus having a high magnification for exposure to a critical layer, and the second exposure apparatus having a low magnification for exposure to a rough layer is executed.

The layout of each shot positioned by a step and repeat operation is formed by a field-size layout exposed by the exposure apparatus. Focus leveling or alignment is performed based on this layout.

For example, the photolithography step for manufacturing a semiconductor element or the like adopts an exposure apparatus for transferring the pattern of a master (mask or reticle) onto a substrate (wafer, glass plate, or the like) coated with a photoresist. With the recent miniaturization of circuit patterns, a reduction projection exposure apparatus advantageous in resolving power and alignment precision is being employed.

In general, semiconductor elements are manufactured by forming a multilayered circuit pattern in a plurality of shot regions arrayed on a substrate by using different masters. These manufacturing techniques are widely applied in fields other than the semiconductor element manufacturing field. For example, in the magnetic head field, miniaturization is abruptly progressed in response to demands for larger storage capacity, similar to the semiconductor element field.

In the magnetic head manufacturing process, greatly different from the semiconductor element manufacturing process, the step of a pattern formed on a substrate level is several µm, which is much larger than a pattern step of 1 µm or less in the manufacture of a semiconductor element.

In the exposure apparatus, a plane position detection mechanism for aligning the position of a substrate serving as an object to be exposed to the image plane of an exposure region where the pattern of a master is projected comprises a surface level detection system of measuring a plurality of points within the exposure region on the substrate, as disclosed in U.S. Pat. Nos. 4,748,333 and 5,118,957. From pieces of surface level information at a plurality of points, the inclination and surface level within the exposure region are calculated and adjusted.

As for a method of removing a detection error between surface level detection systems, i.e., focus sensors arranged to measure a plurality of points within the exposure region, the detection error is detected and eliminated by a method as disclosed in U.S. Pat. No. 5,118,957.

As described in these patents, the current mainstream of a plane detection mechanism is to adopt an optical system whose light source is a laser, LED, or the like. Generally, in the optical system, the image of a slit illuminated by the light source is diagonally projected on a substrate serving as an object to be detected by using a projection imaging optical system. The slit image reflected by the substrate is formed again on a position detection element by using a light-receiving imaging optical system. Vertical movement of the substrate surface serving as an object to be detected is detected as the positional movement of the slit image on the position detection element.

In this optical system, the substrate surface serving as a surface to be detected is coated with a resist, and planarized satisfactorily enough to regard it as an optical mirror surface. The incident angle to the substrate surface is set to 70° or more to increase the reflectance on the planarized resist surface, thereby detecting the resist surface position.

The plane position detection mechanism comprises position detection systems at a plurality of points set within the exposure region in order to make the exposure region on the substrate coincide with the image plane of the projection optical system. The inclination within the exposure region and the surface level are measured and adjusted to achieve high-precision plane alignment. The difference on the substrate surface (step or difference in surface state caused by the process) detected by the position detection systems at a plurality of points is corrected to perform plane alignment always irrespective of the substrate surface state.

Conventionally, when exposure is done by, e.g., the second exposure apparatus in mix and match exposure using two exposure apparatuses having different exposure fields, layout information of an underlayer is not considered, and the focus precision may degrade. When a focus sensor to be used is determined based on the second exposure layout with respect to a substrate bearing the first exposure layout and focus operation is done, focus measurement is executed in a region where focus measurement points are not positioned on the same pattern. This generates a focus error, degrading the focus precision.

Also, when the focus sensor is located at the boundary between shots at the peripheral portion of a wafer, or when a TEG (test shot), or the like, is exposed, the lower pattern having focus measurement points is different from another region to be exposed. Thus, a focus detection error occurs, degrading the leveling precision.

As a method of calculating as a focus offset the measurement difference of the focus sensor generated depending on the lower pattern structure, Japanese Patent Laid-Open No. 2-102518 discloses a method of correcting the focus offset by using the periodicity of a pattern having a plurality of identical structures on the substrate. The conventional method does not consider underlayer information, and measurement fails on a pattern having identical structures. A detection error occurs, or the information amount on the substrate decreases. As a result, a measurement error may occur in the calculated focus offset.

As described above, a pattern is formed on a substrate on which an element is to be formed. For this reason, the substrate surface has steps and is corrugated. If the corrugations are relatively small, like a semiconductor element integrated circuit, they can be coped with by a conventional technique. In fields other than the semiconductor element field, especially in the magnetic head manufacturing process, some corrugations are very large, which degrades the focusing precision and plane alignment precision.

That is, if corrugations are relatively small, like a semiconductor element, the surface of a resist applied to a pattern can be regarded as a mirror surface. A beam incident on the surface is reflected at an almost predetermined reflection angle to form a high-quality slit image on the position detection element via the light-receiving imaging optical system.

To the contrary, if corrugations are large, a beam incident on the step boundary or slope is reflected into a deflected beam at a reflection angle different than on a flat resist surface in accordance with the degree of corrugations.

When the deflection angle is large, part or almost all of the reflected beam deflected by the light-receiving image optical system is eclipsed. The reflected beam poses a problem in forming a slit image on the position detection element again.

More specifically, the reformed slit image becomes asymmetric, or the slit image itself disappears. The detection precision decreases, or detection itself fails.

To solve this problem, the conventional optical plane position detection mechanism takes the following measures. That is, a slit image to be projected is enlarged to decrease the ratio at which corrugations occupy the region of the substrate surface where the slit image is reflected. Alternatively, the detection position of the substrate is moved only in measurement such that the position where the slit image is projected becomes a relatively flat portion almost free from the influence of corrugations.

Even if the size of the slit image is changed, the decrease in detection precision depending on the process cannot be completely prevented because the influence of steps remains. Upon changing the chip size and the chip array within the exposure region, i.e., shot, the detection positions of corrugations change, and surface level detection results vary. The conventional mechanism does not solve such essential problems.

Changing the detection position is effective for increasing the surface level detection precision of one sensor. In plane alignment, a plurality of focus position detection sensors are laid out at fixed positions within the shot. These sensors can only be set to the average positions of some or a plurality of sensors. Portions within chips that are measured by the respective sensors become indefinite depending on the chip layout. The sensors may measure the above-mentioned corrugations or slopes. The plane alignment precision degrades owing to the above reasons.

SUMMARY OF THE INVENTION

The present invention has been proposed to solve the conventional problems, and has as its object to provide an exposure method and exposure apparatus capable of increasing the focus precision and the leveling precision, measuring a pattern having identical structures, and preventing any detection error or measurement error. It is another object of the present invention to provide a plane alignment method capable of detecting the surface level of a substrate at high precision without any influence of a pattern. It is still another object of the present invention to increase the plane alignment precision.

To solve the above problems and to achieve the above objects, the exposure apparatus and exposure method according to the present invention have the following arrangement.

More specifically, according to the present invention, there is provided an exposure method in which an exposure apparatus having a projection optical system for projecting a pattern of a master onto a substrate, and plane position detection means for detecting a plurality of plane positions of the substrate is used to perform first exposure to the substrate with a first exposure layout at a first exposure field size, and then perform second exposure with a second exposure layout at a second exposure field size, the method comprising: determining, prior to the second exposure, a position where a plane position is to be detected on the basis of at least one of the first exposure field size, the first exposure layout, and underlayer information of the first exposure, and detecting the plane position.

Preferably, in the exposure method, the exposure apparatus comprises first driving means for driving the substrate in a direction perpendicular to an optical axis of the projection optical system, and drives the substrate so as to detect the plane position at the determined position.

Preferably, in the exposure method, the exposure apparatus comprises second driving means for driving the substrate along an optical axis of the projection optical system, and drives the substrate on the basis of a detection result of the plane position.

Preferably, in the exposure method, the first and second exposure field sizes are different from each other, and the first and second exposure layouts are different from each other.

More preferably, in the exposure method, the second exposure field size is larger than the first field size.

Preferably, the exposure method includes the steps of obtaining an error generated depending on a pattern structure on the substrate, and correcting a detection result of the plane position by the error.

Preferably, in the exposure method, the position where the plane position is to be detected is determined within an overlay region where a region exposed by the first exposure at a preceding shot and a region to be exposed by the second exposure at a subsequent shot overlay each other.

According to the present invention, there is provided a plane alignment method when patterns of masters are projected onto a plurality of shot positions on a substrate by overlay exposure, the method comprising:
identifying identical pattern arrays on the substrate from pattern layout information on the substrate, and detecting plane positions at positions where patterns are identified to be identical.

Preferably, in the plane alignment method, the pattern layout information is obtained based on an exposure layout and a chip array within a shot when the patterns of the masters are projected onto the plurality of shot positions on the substrate by overlay exposure.

Preferably, in the plane alignment method, the pattern layout information is obtained based on detection results of plane positions within a chip including a chip boundary and at a peripheral portion of the chip.

Preferably, in the plane alignment method, the pattern layout information is obtained based on position information within an arbitrarily set chip.

Preferably, in the plane alignment method, the number of focus detection sensors for detecting plane positions, and positions of the focus detection sensors are arbitrarily designated.

Preferably, in the plane alignment method, detection of the plane position is performed at at least three portions, and the number of plane position detection operations and positions of the plane position detection operations are automatically set or arbitrarily designated in accordance with the number of focus detection sensors for detecting plane positions.

With the above arrangement, a focus sensor can be properly selected at each exposure position on the basis of layout information of an underlayer, increasing the focus or leveling precision.

According to the present invention, there is provided an exposure apparatus which projects patterns of masters onto a plurality of shot positions on a substrate by overlay exposure, the apparatus comprising: setting means for setting pattern layout information on the substrate; and plane alignment control means for controlling plane alignment for performing overlay exposure at the plurality of shot positions on the substrate on the basis of the pattern layout information set by the setting means, wherein the plane alignment control means identifies identical pattern arrays on the substrate from pattern layout information on the substrate, detects plane positions at positions where patterns are identified to be identical, and controls the plane alignment on the basis of detection results.

Alternatively, according to the present invention, there is provided an exposure apparatus comprising: a projection optical system for projecting a pattern of a master onto a substrate; and plane position detection means for detecting a plurality of plane positions of the substrate, wherein, when first exposure is performed to the substrate with a first exposure layout at a first exposure field size, and then second exposure is performed with a second exposure layout at a second exposure field size, the plane position detection means determines, prior to the second exposure, a position where a plane position is to be detected on the basis of at least one of the first exposure field size, the first exposure layout, and underlayer information of the first exposure, and detects the plane position.

According to the present invention, there is provided a semiconductor device manufacturing method comprising the steps of:
installing a plurality of semiconductor manufacturing apparatuses, including the exposure apparatus, in a factory, and
manufacturing a semiconductor device by using the plurality of semiconductor manufacturing apparatuses.

According to the present invention, there is provided a semiconductor manufacturing factory comprising:
a plurality of semiconductor manufacturing apparatuses, including the exposure apparatus,
a local area network for connecting the plurality of semiconductor manufacturing apparatuses, and
a gateway for connecting the local area network to an external network outside the semiconductor manufacturing factory.

According to the present invention, there is provided a maintenance method for an exposure apparatus, comprising the steps of:
preparing a database for accumulating information about maintenance of the exposure apparatus on an external network outside a factory where the exposure apparatus is installed,
connecting the exposure apparatus to a local area network in the factory, and
maintaining the exposure apparatus on the basis of the information accumulated in the database by using the external network and the local area network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 12A and 12B are views showing an example of a corrugation on a chip according to the present invention, in which FIG. 12A is a plan view and FIG. 12B is a side view;

FIGS. 18A to 18F are plan views showing Example 1 of a plane alignment method according to the present invention, in which FIG. 18A is a plan view showing the measurement (detection) point of a plane alignment apparatus, FIG. 18B is a plan view showing a measurement (detection) point within a shot used for plane alignment, and FIGS. 18C to 18F are plan views for explaining a plane alignment operation sequence;

FIGS. 19A to 19F are plan views showing Example 2 of the plane alignment method according to the present invention, in which FIG. 19A is a plan view showing the measurement (detection) point of the plane alignment apparatus, FIG. 19B is a plan view for explaining a measurement (detection) point within a shot used for plane alignment, and FIGS. 19C to 19F are plane views for explaining a plane alignment operation sequence;

FIG. 24 is a view showing an example of a user interface;

DETAILED DESCRIPTION OF THE PREFERRED EMBODIMENTS

Preferred embodiments of the present invention will now be described in detail in accordance with the accompanying drawings.

(First Embodiment)

Figure 1:
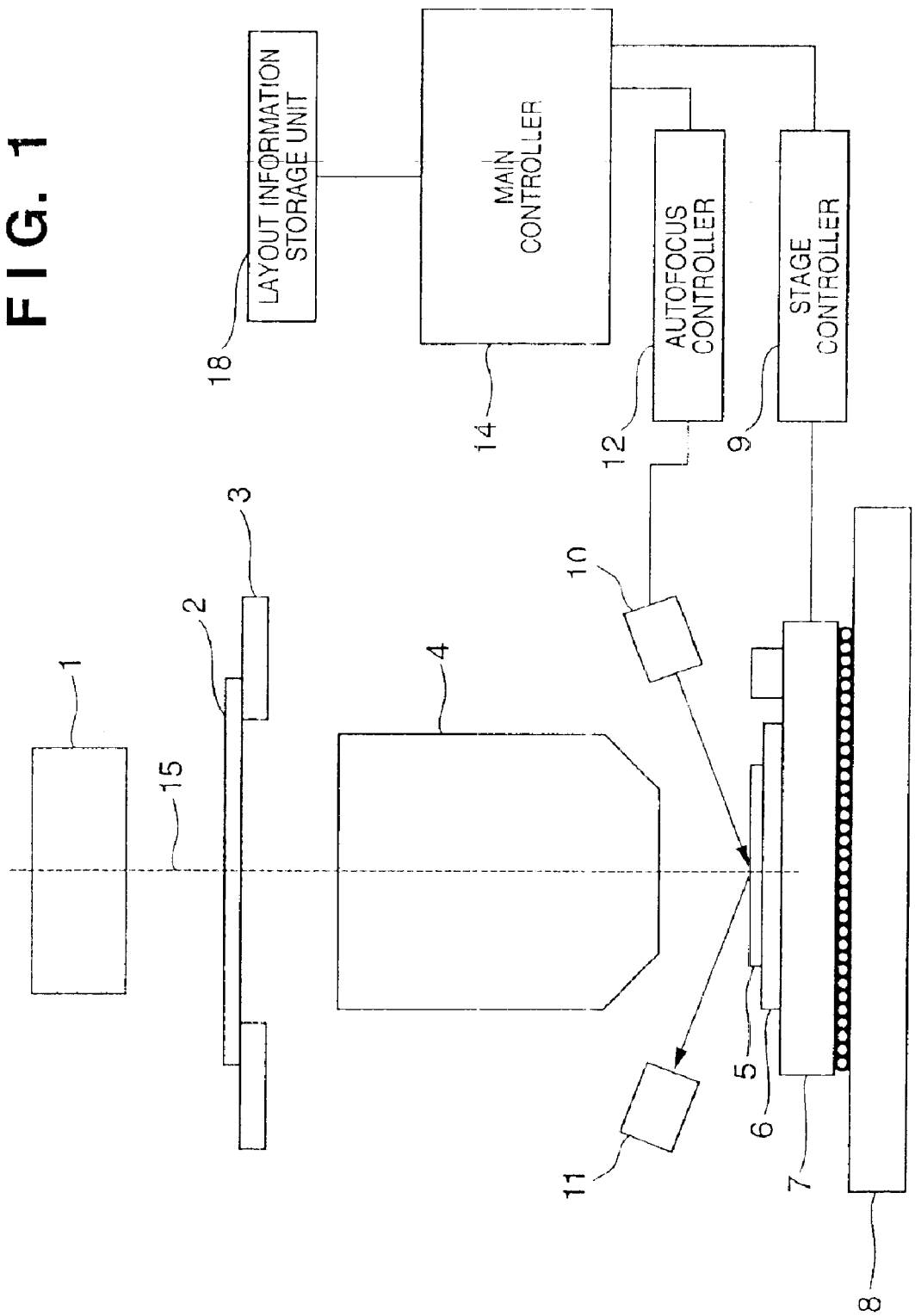
FIG. 1 is a schematic view showing a reduction projection exposure apparatus using a plane position detection method according to an embodiment of the present invention.

FIG. 1 is a view showing a projection exposure apparatus according to the first embodiment of the present invention. In FIG. 1, reference numeral 1 denotes an illumination system; 2, a reticle serving as a master on which a device pattern is formed; 3, a reticle stage which holds the reticle 2; 4, a projection optical system which reduces and projects the device pattern of the reticle 2; 5, a wafer serving as a substrate on which the device pattern is projected and transferred; 6, a wafer chuck which holds the wafer 5; 7, a wafer stage which holds the wafer chuck 6, two-dimensionally moves along a plane perpendicular to an optical axis 15, and is also movable along the optical axis 15; 8, a surface plane on which the projection optical system 4 and wafer stage 7 are mounted; and 9, a stage controller which controls the operation of the wafer stage 7 in order to sequentially transfer the pattern of the reticle 2 onto a region to be exposed on the wafer 5 by a step and repeat method.

Reference numerals 10 and 11 denote autofocus detection systems which detect the position of the surface of the wafer 5 along the optical axis. The autofocus detection system 10 is an illumination device which illuminates the wafer 5. The autofocus detection system 11 is a light-receiving device which outputs a signal corresponding to the position of the surface of the wafer 5 along the optical axis 15. Reference numeral 12 denotes an autofocus controller; and 14, a main controller which executes alignment control and focusing operation of each position to be exposed on the basis of layout information obtained from a layout information storage unit 18.

Figure 2:
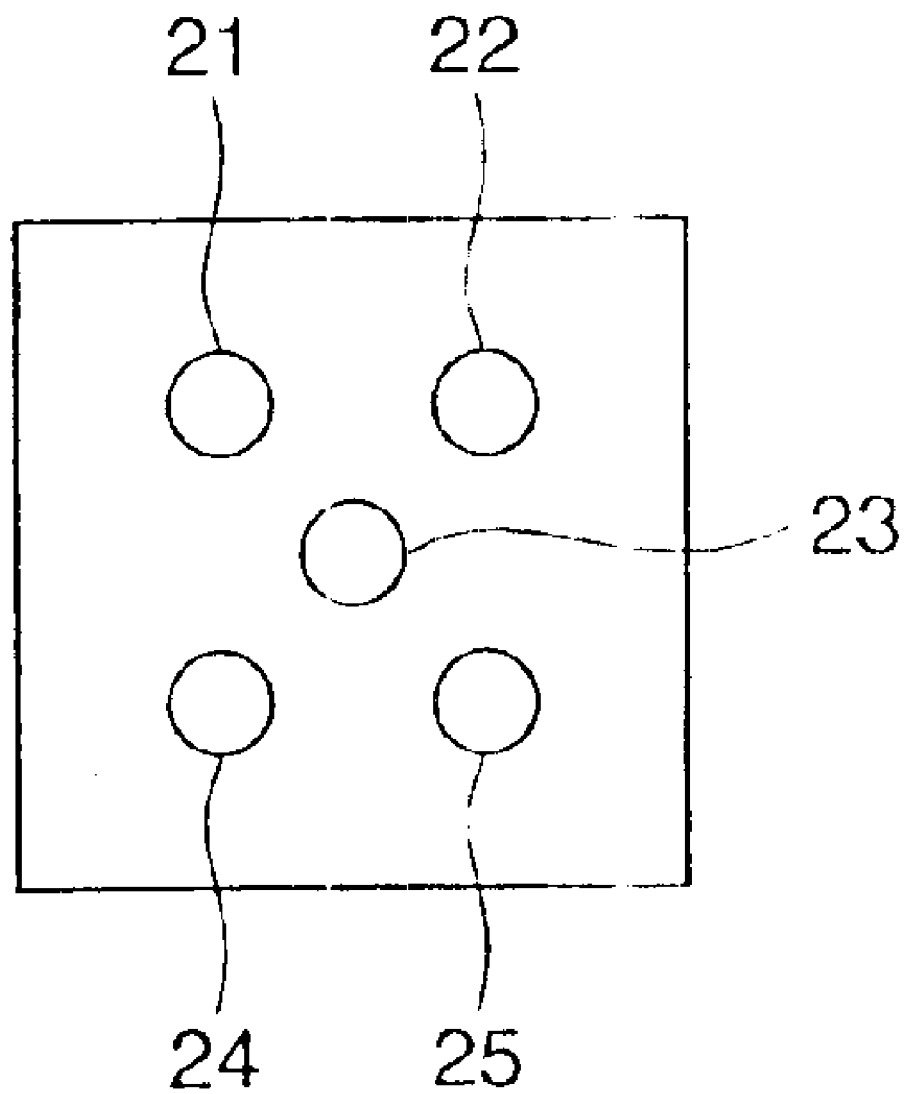
FIG. 2 is a plan view for explaining the layout of focus measurement points set within a region to be exposed according to the first embodiment of the present invention.

FIG. 2 is a plan view showing five focus measurement points within a region to be exposed. A measurement point 23 is located at almost the center of this region. Remaining measurement points 21, 22, 24 and 25 are located at the peripheral portion of the region.

Figure 3:
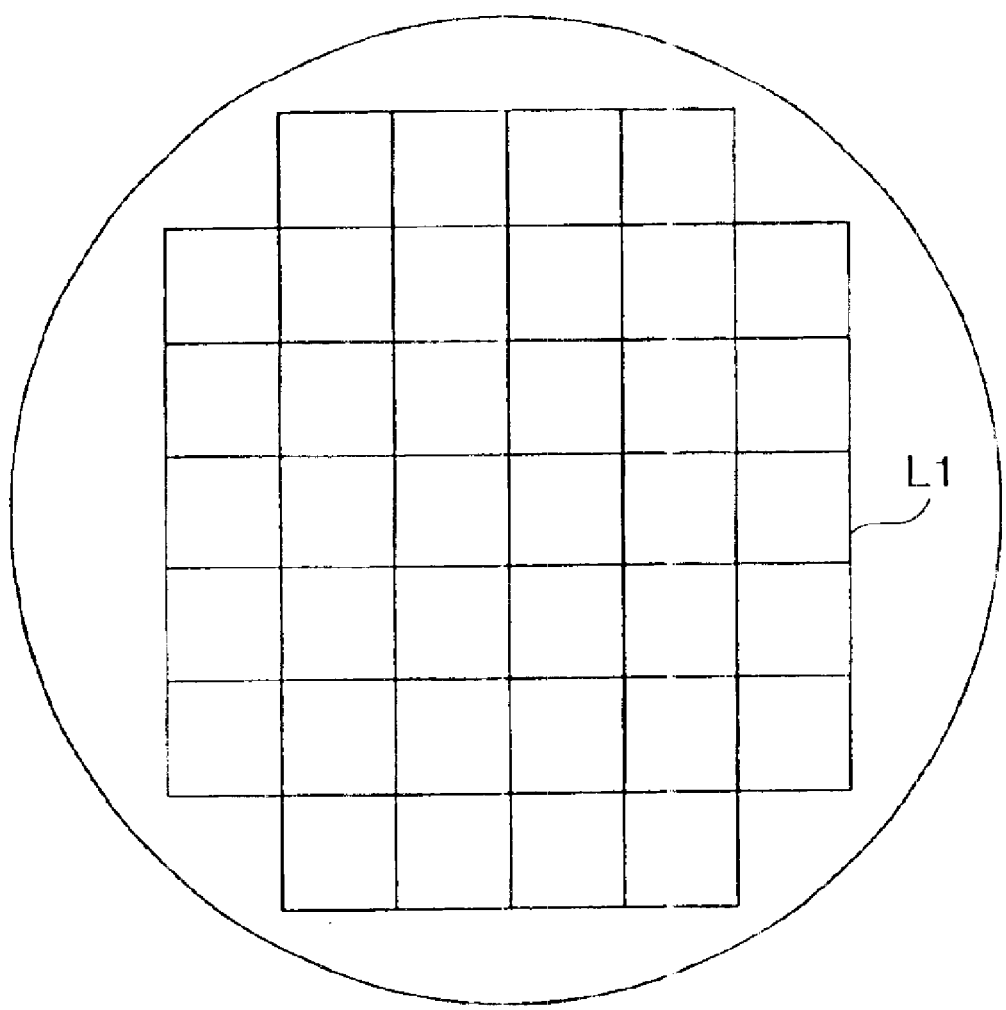
FIG. 3 is a plan view showing an exposure layout in a small-exposure-size exposure apparatus (high-magnification stepper) according to the first embodiment of the present invention.

FIG. 3 shows layout information L1 already exposed by the first exposure apparatus.

Figure 4:
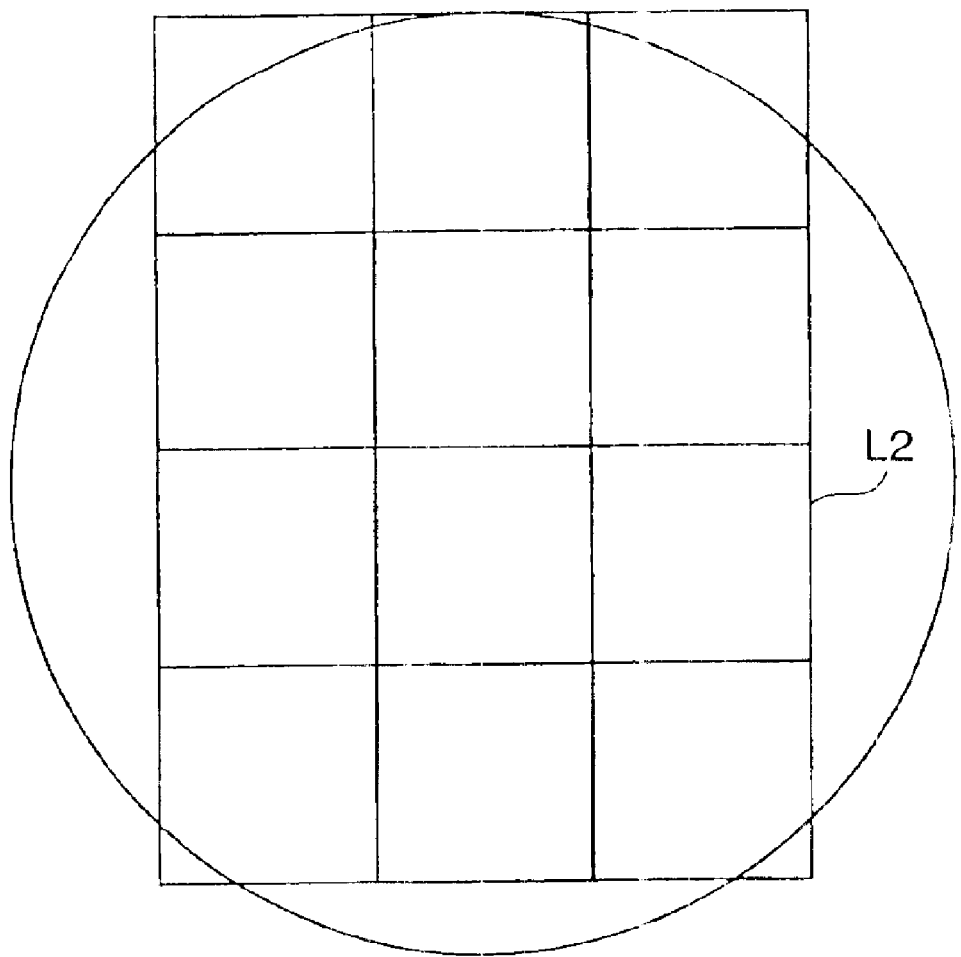
FIG. 4 is a plan view showing an exposure layout in a large-exposure-size exposure apparatus (low-magnification stepper) according to the first embodiment of the present invention.

FIG. 4 shows layout information L2 representing respective exposure positions in the second exposure apparatus.

Figure 5:
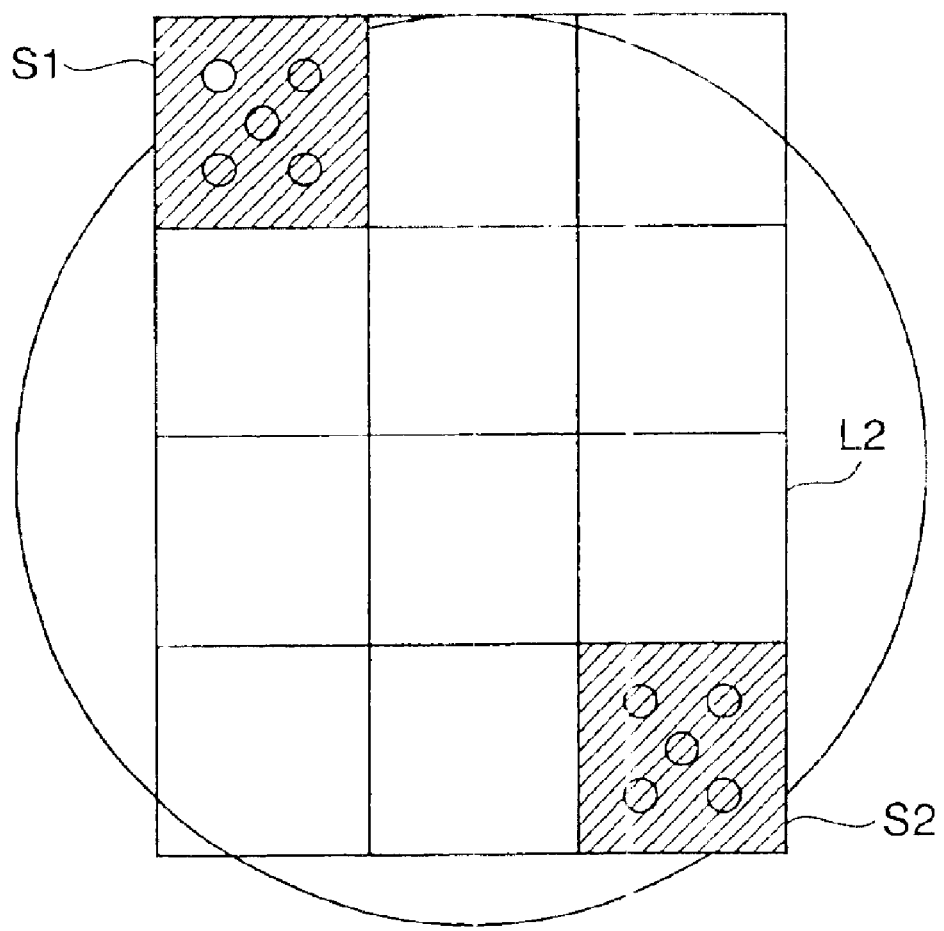
FIG. 5 is a plan view showing the exposure position of the large-exposure-size exposure apparatus and the layout of usable focus measurement points according to the first embodiment of the present invention.

FIG. 5 is a plan view showing respective exposure positions and the layout of focus; measurement points when each shot is exposed by a conventional second exposure apparatus. At a shot position S1, the measurement point 21 is located outside the wafer and does not undergo focus measurement. Focusing operation is performed using the remaining measurement points 22 to 25. At a shot S2, focusing operation is performed using all the measurement points 21 to 25.

Figure 6:
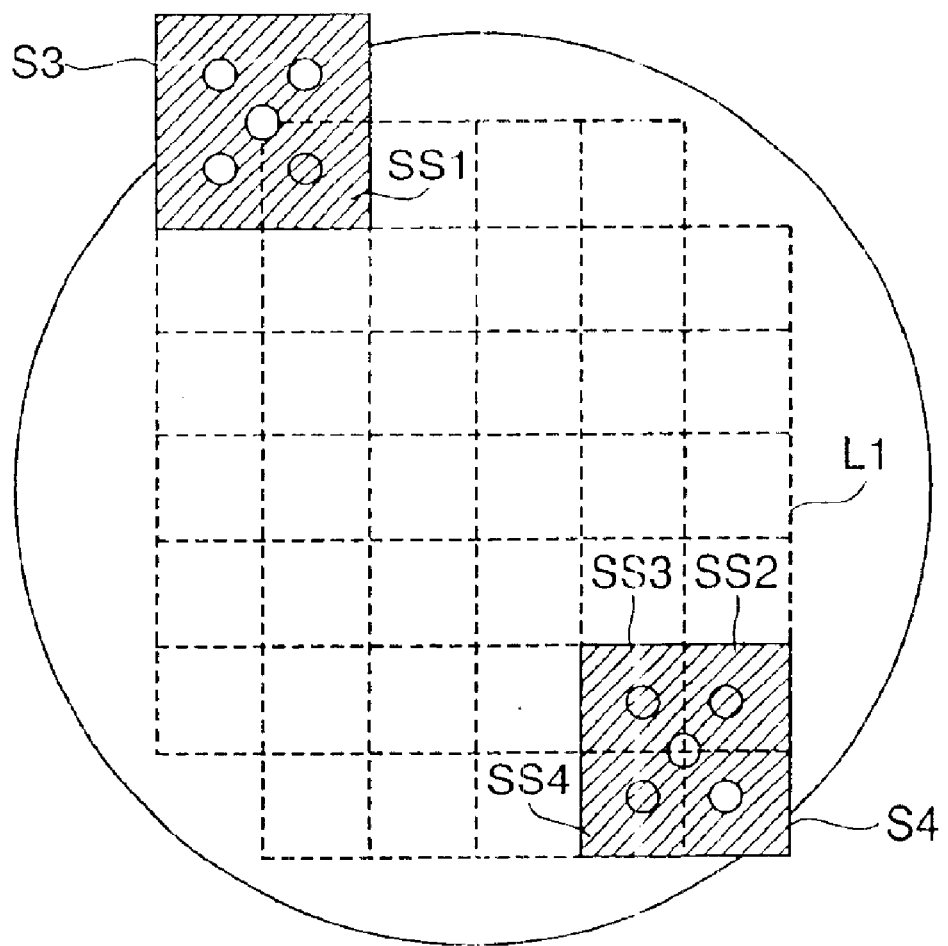
FIG. 6 is a plan view showing the exposure position of the small-exposure-size exposure apparatus and the layout of usable focus measurement points according to the first embodiment of the present invention.

FIG. 6 is a plan view for explaining an example of the first embodiment of the present invention. Focus measurement points used for exposure by the second exposure layout are selected based on the first exposure layout information L1 obtained from the layout information storage unit 18. A TEG (test shot), or the like, may be used as exposure layout information.

Exposure of a shot S3 uses the focus measurement point 25 located in an overlay region where a region to be exposed at the subsequent shot S3 overlays an exposed region SS1 at a preceding shot on the first exposure layout that is contained in the region to be exposed at the shot S3 after the first exposure layout information L1 and second exposure layout information L2 are overlaid. The region to be exposed except for SS1 undergoes a focusing operation without using the remaining measurement points 21 to 24 because the lower pattern falls outside the overlay region, unlike SS1.

Similarly, at a shot S4, a focusing operation and a leveling operation are performed using the focus measurement points 21, 22, and 24 located within an overlay region where a region to be exposed at the shot S4 overlays exposed regions SS2 to SS4 on the first shot exposure layout that are contained in the shot S4.

(Second Embodiment)

Figure 7:
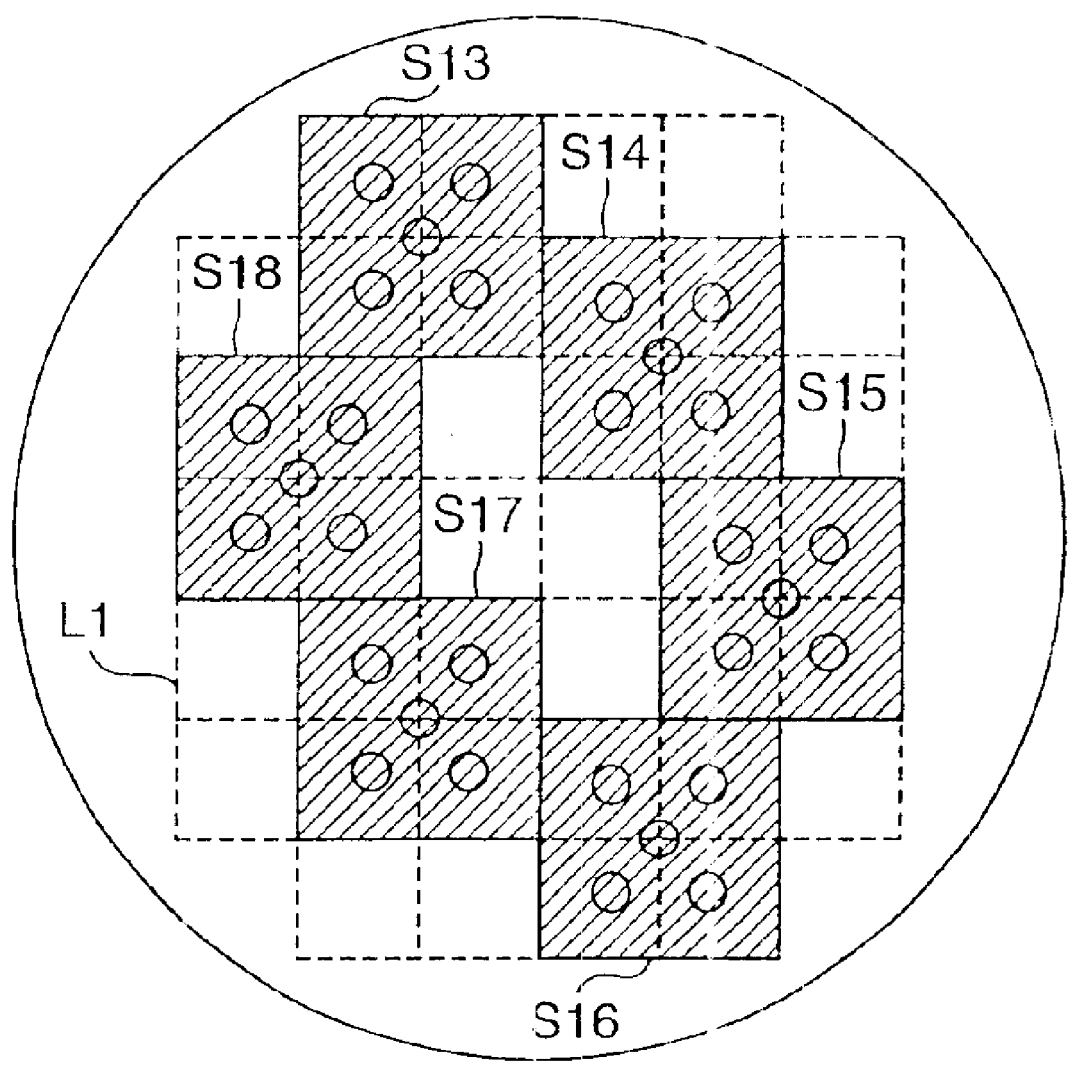
FIG. 7 is a plan view showing a measurement position for calculating an error generated depending on the pattern structure according to the second embodiment of the present invention.

FIG. 7 is a plan view showing the layout of focus measurement points when a focus measurement error caused by the pattern structure is detected as an example of the second embodiment of the present invention. Measurement shots are selected so that focus measurement points may be laid out at positions where the identical pattern structures are formed, and focus measurement is performed at those measurement shots. The focus measurement error is computed by performing statistics processing of the measurement result.

In this case, if the measurement shots are selected based on second exposure layout information L2, sufficient numbers of the measurement shots are not obtained and the focus measurement error cannot be computed with sufficient accuracy. Therefore, it is desirable to select S13–S18 as measurement shots based on first exposure layout information L1 so that focus measurement points may be laid out at positions where identical pattern structures are formed as shown in FIG. 7.

Thus, because the numbers of the measurement shots can be increased by selecting the measurement shots, not based on second exposure layout information L2, but based on first exposure layout information L1, a focus measurement accuracy can be computed with sufficient accuracy.

In addition, S13–S18 of FIG. 7 are an example and other combinations are also alternatively possible.

(Third Embodiment)

Figure 8:
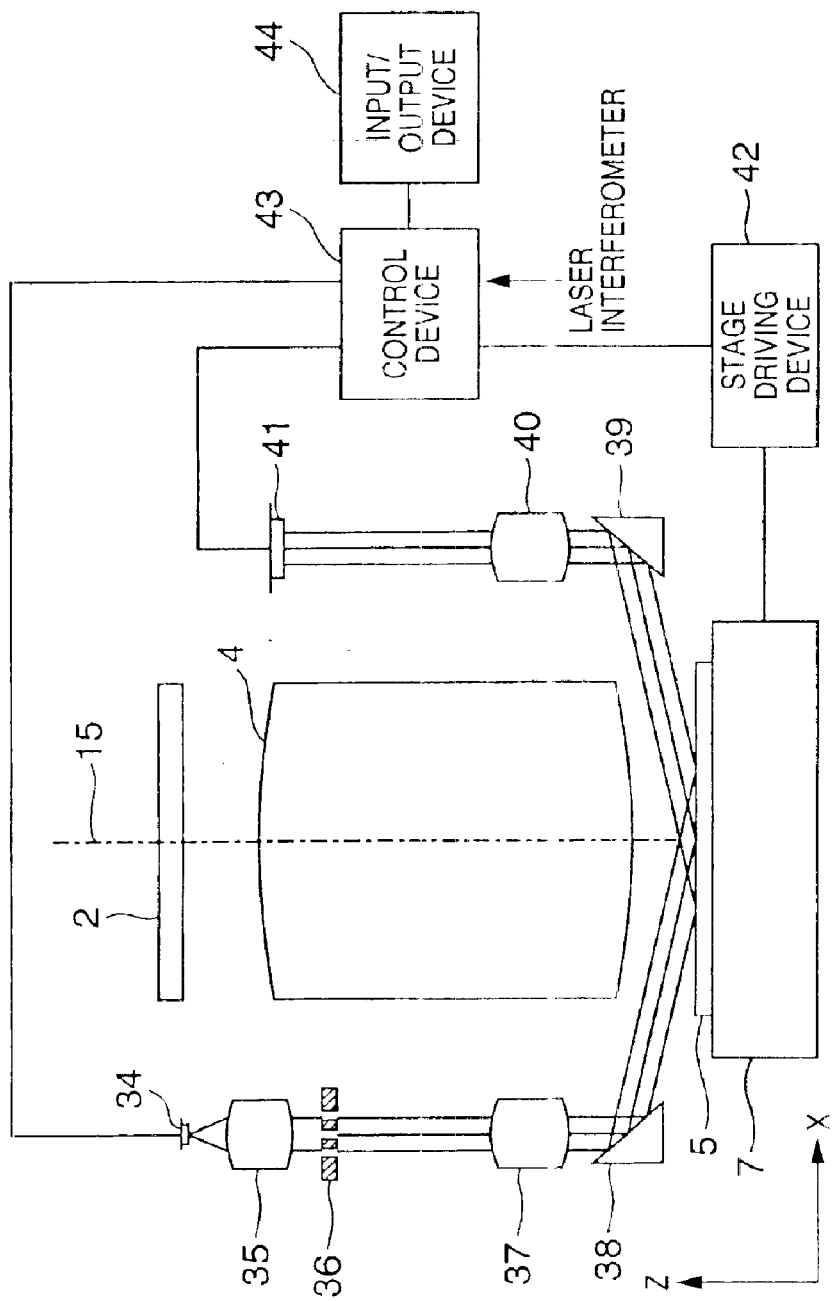
FIG. 8 is a schematic view showing the plane alignment apparatus of an exposure apparatus according to the third embodiment of the present invention.

FIG. 8 is a partial, schematic view showing an exposure apparatus using a plane position detection method according to the third embodiment of the present invention.

In FIG. 8, reference numeral 4 denotes a projection optical system having an optical axis 15. The projection optical system 4 projects the pattern of a master, i.e., reticle 2 and forms the reticle pattern image on the image plane.

The optical axis 15 is parallel to the z direction in FIG. 8. Reference numeral 5 denotes a substrate, i.e., wafer which has a surface coated with a resist and bears an array of regions (shots) to be exposed that are formed by the preceding exposure step; and 7, a stage which holds the wafer 5. The wafer 5 is chucked and fixed by the wafer stage 7. The wafer stage 7 is made up of an X stage which moves in the X-axis direction, a Y stage which moves in the y-axis direction, and a Z stage which rotates about the z-axis direction and axes parallel to the x-, y-, and z-axis directions. The x-, y-, and z-axes are set perpendicularly to each other. By driving the wafer stage 7, the surface position of the wafer 5 can be adjusted along the optical axis 15 of the projection optical system 4 within a plane perpendicular to the optical axis 15. The inclination of the wafer 5 with respect to the reticle pattern image can also be adjusted.

Figure 9:
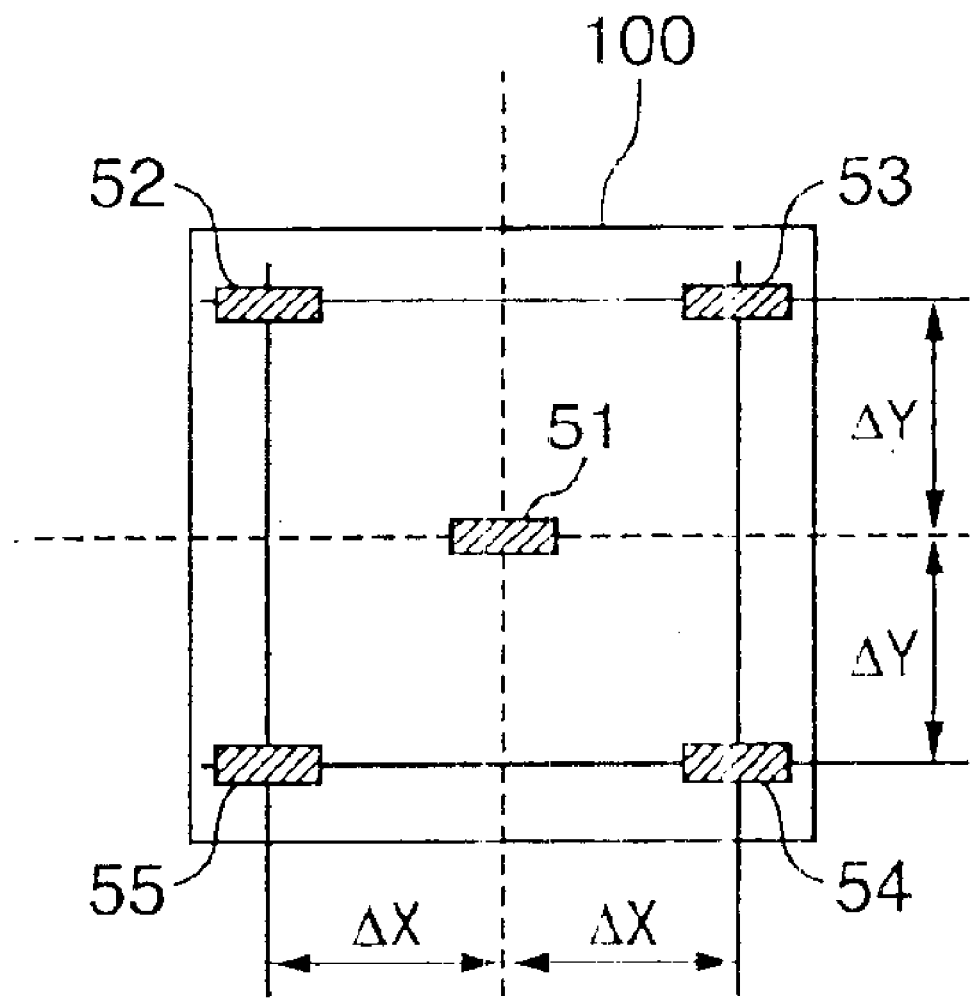
FIG. 9 is a plan view showing an example of a slit projection layout within a region to be exposed that is used for plane alignment according to the present invention.

In FIG. 8, reference numerals 34 to 41 denote respective elements of a detection optical system arranged to detect the surface position and inclination of the wafer 5. The element 34 is a high-luminance light source such as a light-emitting diode or semiconductor laser. The element 35 is an illumination lens. Light emitted by the light source 34 is adjusted into almost parallel beams via the illumination lens 35. The beams illuminate the mask 36 having a plurality of pinholes. A plurality of beams having passed through the pinholes of the mask 36 enter the deflecting mirror 38 via the imaging lens 37. After the directions of the beams are changed by the deflecting mirror 38, the beams enter the surface of the wafer 5. The imaging lens 37 and deflecting mirror 38 form pinhole images on the wafer 5. A plurality of beams irradiate five portions (51 to 55) including the center of a region 100 to be exposed on the wafer 5, as shown in FIG. 9, and are reflected at the respective portions. In the third embodiment, five slit-like pinholes are formed in the mask 36, and the positions of five measurement points including the center are measured within the region 100.

The directions of the beams reflected at the respective measurement points on the wafer 5 are changed by the deflecting mirror 39. Then, the beams enter the two-dimensional position detection element 41 via the detection lens 40. The detection lens 40 cooperates with the imaging lens 37, deflecting mirror 38, wafer 5, and deflecting mirror 39 to cause the two-dimensional position detection element 41 at an optically conjugate position to detect the images of the pinholes of the mask 36.

The two-dimensional position detection element 41 is formed from a CCD or the like, and can independently detect the incident positions of a plurality of beams on its light-receiving surface. A change in position of a projection lens 1 of the wafer 5 along the optical axis 15 can be detected as a shift in the incident positions of a plurality of beams on the two dimensional position detection element 41. The position of the wafer surface, along the optical axis 15, at the five measurement points 51 to 55 within the region 100 to be exposed on the wafer 5 can be detected based on an output signal from the two-dimensional position detection element 41. The output signal from the two-dimensional position detection element 41 is input to a control device 43 via a signal line.

The displacements of the wafer stage 7 along the x- and y-axes are measured by a known method using laser interferometers (not shown). A signal representing the displacement amount of the wafer stage 7 is input from the laser interferometer to the control device 43 via signal line. Movement of the wafer stage 7 is controlled by a stage driving device 42. The stage driving device 42 receives a command signal from the control device 43 via a signal line, and drives the wafer stage 7 in response to this signal. The stage driving device 42 has first and second driving means. The first driving means adjusts a position (x, y) and rotation (θ) of the wafer 5 within a plane perpendicular to the optical axis 15. The second driving means adjusts the position and inclination (φx, y) of the wafer 5 in the direction (z direction) of the optical axis 15.

The control device 43 processes an output signal (plane position data) from the two-dimensional position detection element 41, and detects the surface position of the wafer 5. On the basis of this detection result, the control device 43 inputs a predetermined command signal to the stage driving device 42. The second driving means of the stage driving device 42 operates in response to this command signal, and adjusts the position and inclination of the wafer 5 along the optical axis 15.

An input/output device 44 is used to input the exposure conditions of the wafer 5 such as an exposure layout and chip array information, and output exposure results, various measurement results, and the like.

A method of detecting the surface level of the wafer 5 whose surface is corrugated, by using the plane alignment method of the present invention will be explained.

Figure 10:
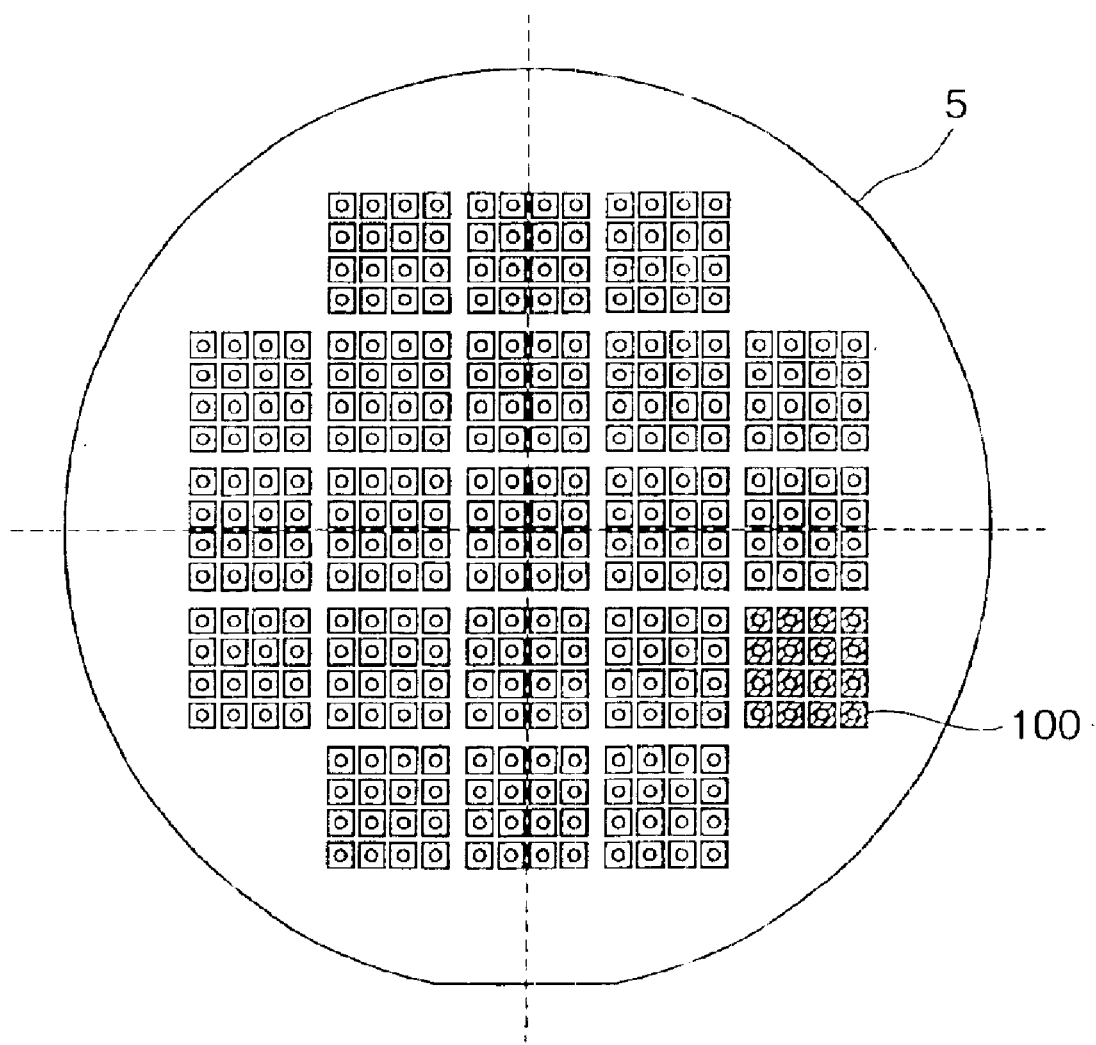
FIG. 10 is a plan view showing an example of an exposure layout within a wafer according to the present invention.
Figure 11:
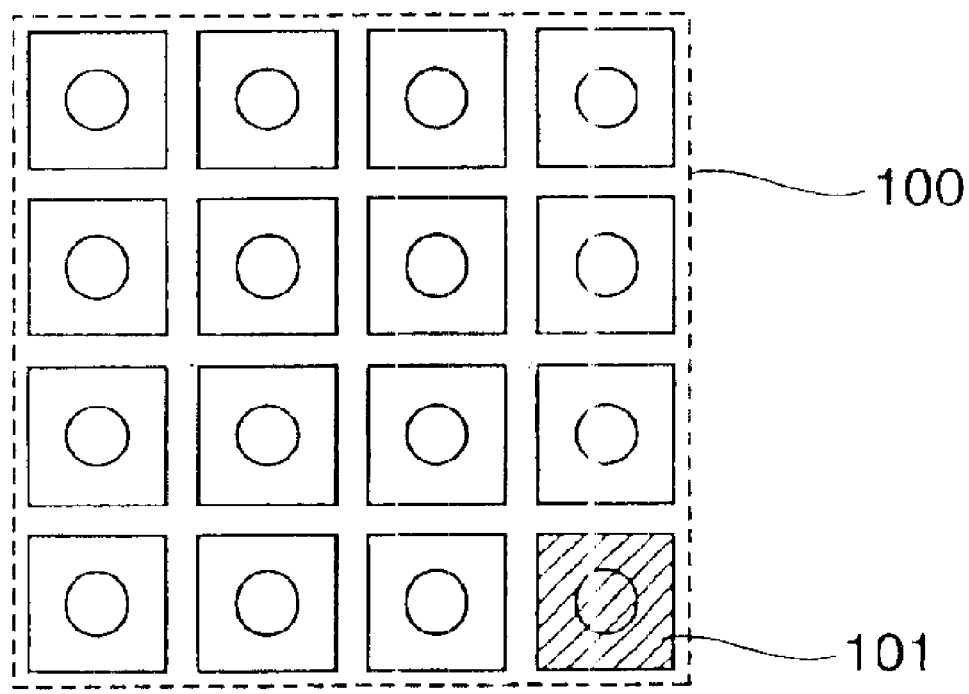
FIG. 11 is a plan view showing an example of a chip layout within a shot according to the present invention.

As shown in FIG. 10, a plurality of shots 100 are laid out on the wafer 5. As shown in FIG. 11, a plurality of chips 101 are laid out within each shot. These pieces of information are input in advance from the input/output device 44 shown in FIG. 8. Signals are transmitted to the control device 43 and stage driving device 42 to drive the wafer stage 7. The pattern of the reticle 2 is transferred onto the wafer 5 coated with a resist, thus patterning the wafer 5.

After that, a wafer process (to be described later) is executed to form corrugations 102.

These patterns are generally formed by repetitively exposing shots laid out on a wafer with the same reticle pattern by a step and repeat method. A plurality of chips having identical patterns formed on the reticle are laid out within each shot. In FIG. 10, the shot interval is wide in order to express the image of the shot 100. In practice, chip patters are often arrayed at the same interval on a wafer in consideration of dicing of cutting chips in a step called a post-process.

As for detection of the z and inclination directions of the wafer 5, they are adjusted by measuring, e.g., the measurement points 51 to 55 shown in FIG. 9. The positions of the measurement points 51 to 55 are determined by the shapes of slit-like pinholes shown in FIG. 9. The measurement points 51 to 55 are fixed within the region 100 to be exposed.

Figure 13:
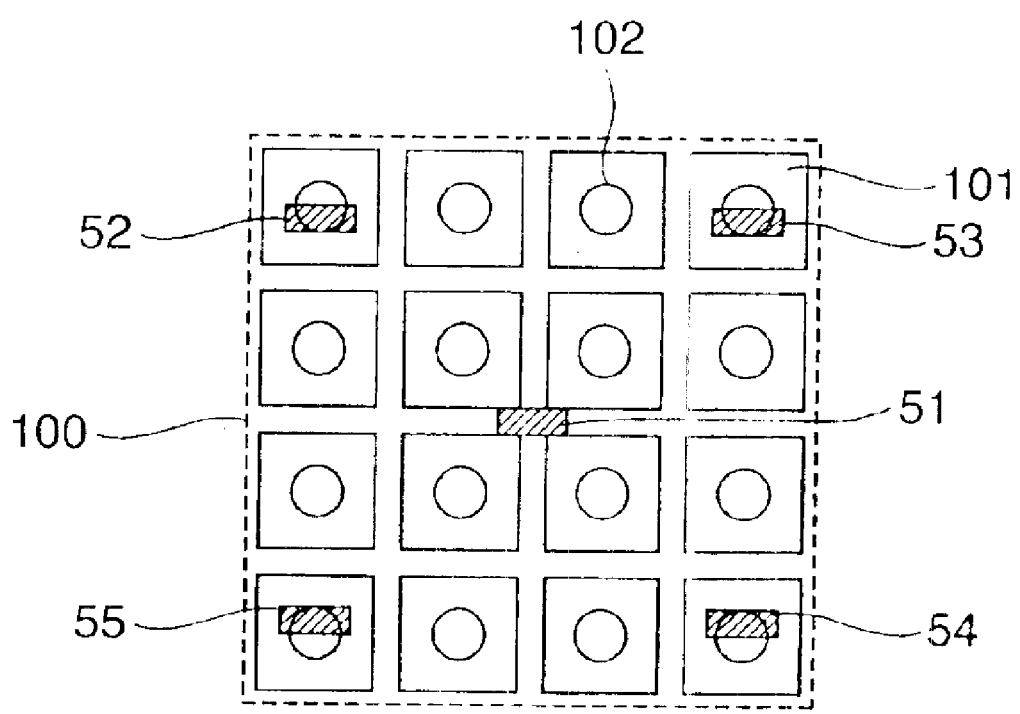
FIG. 13 is a plan view showing an example of a conventional plane position detection position when corrugation exists on a chip.

In the prior art, as shown in FIG. 13, the corrugations 102 and the slit-like measurement points may match to degrade the measurement precision, as described above. One of the objects of the present invention is to solve this problem.

According to the outline of this embodiment, the array positions of the chips 101 on the wafer 5 are recognized by calculation. Then, measurement points within the shot 100 are determined in accordance with preset conditions such as the number of measurement points within a shot, the number of measurement points within a chip, and the number of sensors and sensor positions in a plane alignment apparatus used. The determined measurement points are detected by a designed detection sensor, calculated, and adjusted.

The third embodiment will be explained in detail.

Figure 20:
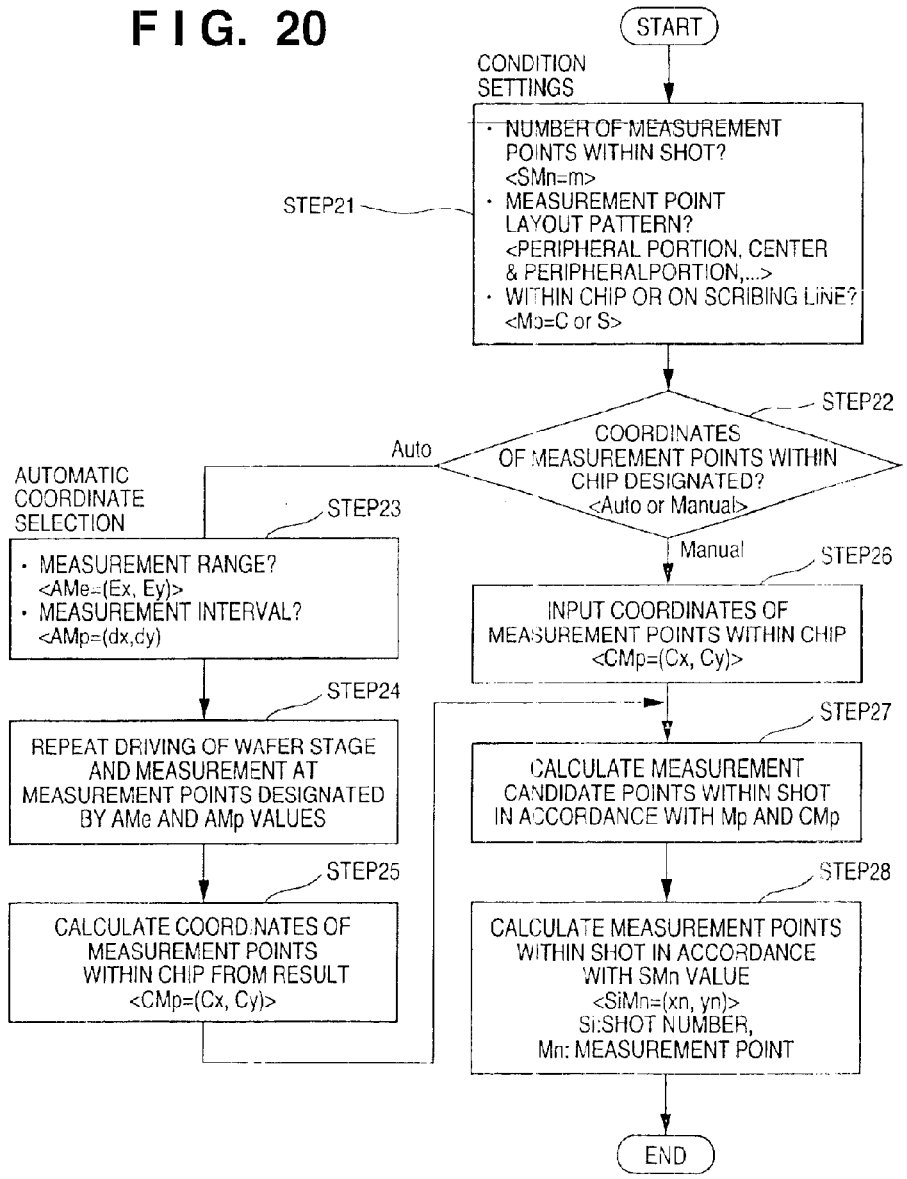
FIG. 20 is a flow chart showing an example of determining a measurement point within a shot according to the present invention.

FIG. 20 is a flow chart showing an example of determining measurement points within a region (shot) to be exposed.

In step 21, condition settings for determining measurement points are input from the input/output device 44 shown in FIG. 8.

The setting items are the number SMn of measurement points for obtaining a plane position within a shot, the layout pattern of measurement points within the shot, and a selection value Mp for selecting whether measurement points within the shot are set within chips or on scribing lines.

The number SMn of measurement points within the shot is the number of points where the plane state within the shot is measured to align a region (shot) to be exposed to the image plane of a projection lens. The number SMn of measurement points suffices to be at least three, which is the minimum number of points that can form a plane. Alternatively, the number of measurement points within the shot is maximized to all the chips within the shot. This can minimize the influence of a decrease in flatness upon plane deformation within the shot caused by the plane precision of a wafer serving as a substrate, annealing, or the like.

Setting of the layout pattern of measurement points within the shot is setting of a rough layout pattern such as a pattern in which measurement points are laid out only at the peripheral portion of the shot, or a pattern in which measurement points are laid out near the center of the shot and at the peripheral portion of the shot. This facilitates automatic setting within the shot together with the number of measurement points within the shot.

Figure 14:
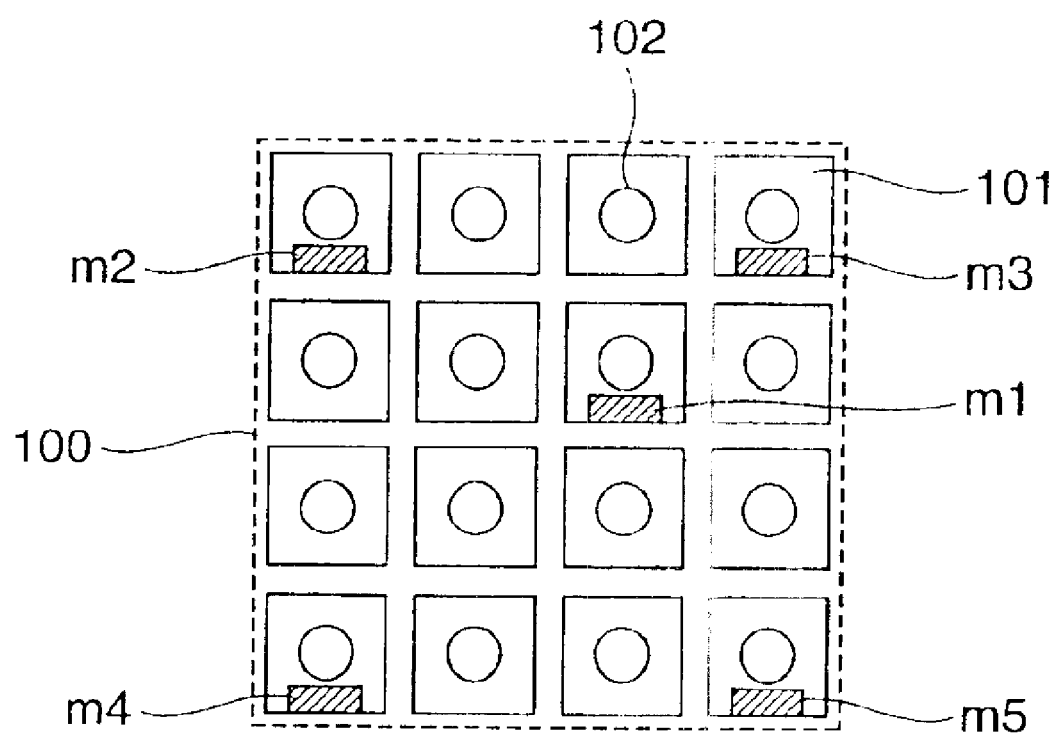
FIG. 14 is a plan view showing Example 1 of a measurement (detection) point according to the present invention.
Figure 16:
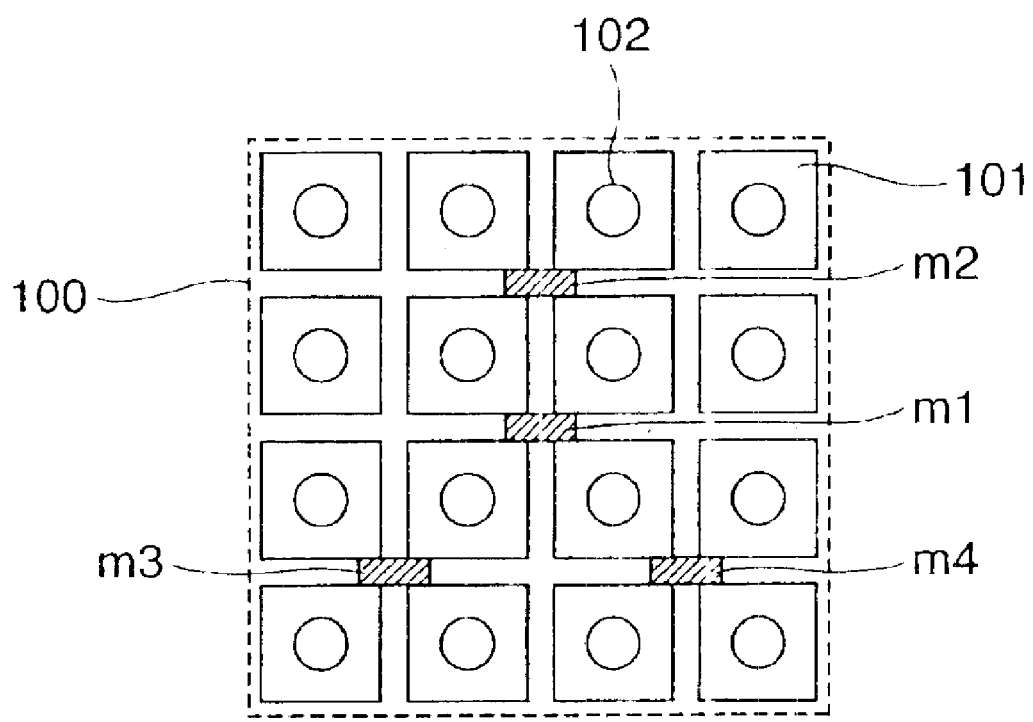
FIG. 16 is a plan view showing Example 3 of the measurement (detection) point according to the present invention.

The selection value Mp for selecting whether measurement points within the shot are set with chips or on scribing lines is a setting necessary to calculate the candidate positions of measurement points within the shot in a post-process. A case wherein measurement points m1 to m5 are set within the chips 101, as shown in FIG. 14, will be called a setting within the chips. A case wherein measurement points are laid out on scribing lines between the chips 101 (between two or four chips), as shown in FIG. 16, will be called a setting on the scribing lines.

In step 22, a setting for determining whether the coordinates of measurement points within chips are set manually (Manual) or automatically (Auto) is input from the input/output device 44 shown in FIG. 8. If the coordinates are to be set manually, coordinate positions within chips are directly input. In general, the corrugation shape within the chip is determined by the manufacturing process, and can be obtained from the design value. Which point is set as a measurement point can be easily determined from the design value and the slit shape of the measurement (detection) point. Coordinate positions within the chips can be input.

As the manufacturing process proceeds through steps, various patterns are formed even at a flat portion. An error may occur in the surface level detection value due to the difference in pattern reflectance through corrugations are small. In this case, coordinates cannot be determined from only step information obtained in advance. Automatic setting is, therefore, adopted.

A method of automatically selecting measurement points within chips will be explained.

In automatically selecting measurement positions within the chip, the chip plane is measured by a plane position detection device while the wafer stage 7 is driven. Measurement data is processed to determined optimal measurement positions.

In step 23, measurement is executed under measurement conditions input from the input/output device 44 shown in FIG. 8 in advance. The measurement conditions are a measurement range AMe within the chips 101 and a measurement interval AMp serving as the step interval of the wafer stage in measurement. If the range value is directly input, the measurement range AMe can be set from previously measured empirical values without measuring redundant measurement points, and the measurement time can be shortened. The chip size, a value twice the chip size, or the like, may be set as an initial value or fixed value. If a measurement range twice or more the chip size is measured, measurement values on the same pattern can be obtained between chips. This facilitates determination of the representative surface level of a chip (to be described later) even if the measurement values within the chip have a gradient distribution.

As for the measurement interval AMp, about one half to one third the detection slit width of the plane position detection device is empirically on optimal value. Depending on corrugations formed on the chip, the measurement interval AMp must be changed. From this, it is desirable to arbitrarily set the measurement interval AMp. However, the measurement interval AMp may be set to a fixed value in consideration of cumbersome setting.

If the above-described selecting value Mp represents the setting on scribing lines, the measurement range is the scribing line interval, i.e., chip array pitch. The chip array pitch is set to a numerical value or division number at which chips are arrayed at an equal interval. Measurement is done within chips under the "setting on scribing lines" condition in order to determined whether measurement values on scribing lines can represent the surface levels of chips upon removing steps from the chips. This measurement can be omitted when it is known in advance that measurement values on scribing lines can represent the surface level.

In step 24, the wafer stage is driven by using as a step pitch the measurement interval AMp within the measurement range AMe in accordance with the above set values. The chip plane is measured by the plane position detection device. The measurement results include a surface level detection error generated by in-plane corrugations within the measurement range, the difference in the reflectance of a process pattern formed within the plane, or the like.

The coordinate positions of measurement points are obtained by arithmetic process of extracting optimal measurement points from the obtained measurement results (step 25). In arithmetic processing, stepped and flat portions are divided by differentiating measurement data. A portion which can most stably represent the surface level of the chip is extracted from step level information attained from the measurement data. Calculated coordinate positions are set as CMp.

In step 27, measurement candidate points which can serve as measurement points within the shot are calculated under the above setting conditions.

This calculation obtains measurement candidate coordinate positions within the shot in accordance with exposure layout information input in advance in order to lay out the shots 100 within the wafer 5 as shown in FIG. 10, chip array information within the shot, the selection value Mp for selecting whether measurement points within the shot are set within chips or on scribing lines, and the set measurement conditions positions CMp within the shot.

The coordinate position data may be held as the central coordinates of each chip from the wafer center serving as wafer coordinates, or as the central coordinates of each chip from the shot center serving as an origin for every shot. In either case, the chip coordinates of an adjacent shot are also calculated to attain the following effects.

In step 28, actual measurement points are calculated from the obtained measurement candidate coordinate positions within the shot. Measurement points are selected in accordance with preset condition settings, the number SMn of measurement points, and the layout pattern values of measurement points within the shot. A measurement point layout algorithm will not be described in detail. To ensure the measurement precision, the measurement span is desirably set as wide as possible uniformly along the peripheral direction within the shot. As for a shot which partially falls outside the wafer, out of shots laid out at the peripheral portion of the wafer 5, measurement points are determined from chips present on the wafer 5. This can realize plane alignment at the peripheral portion of the wafer 5, which is impossible in the prior art, and can increase the precision.

Figure 15:
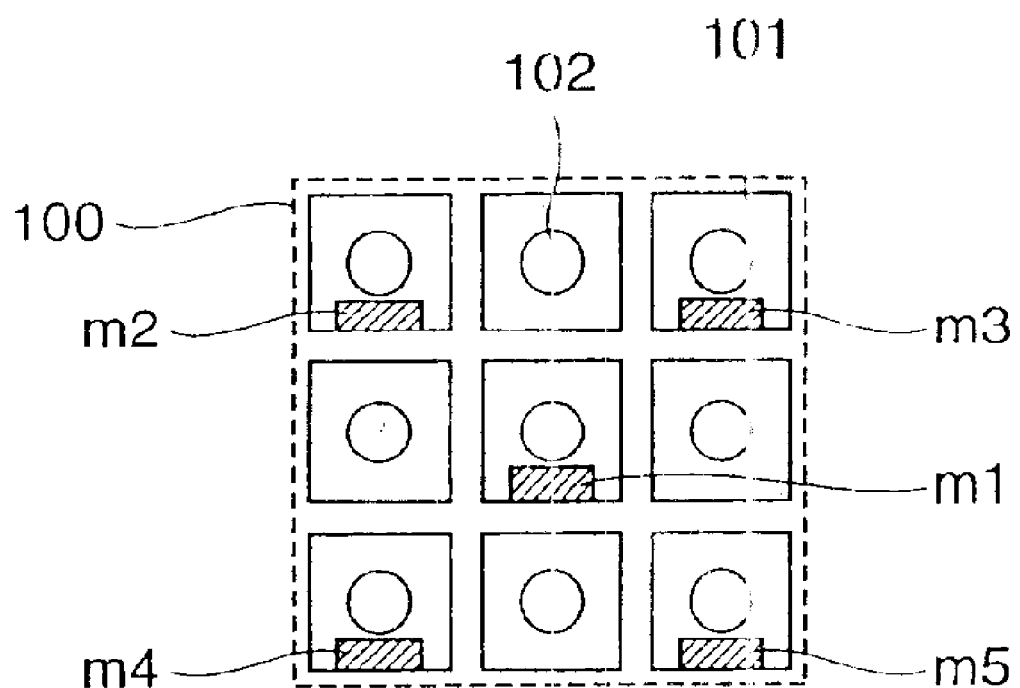
FIG. 15 is a plan view showing Example 2 of the measurement (detection) point according to the present invention.

An example of selecting measurement points within the shot according to the third embodiment will be explained. FIGS. 14 and 15 show an example in which the number of measurement points within a shot is five and each measurement point falls within a chip. FIGS. 14 and 15 show the layout of the chips 101 within the shot 100, and a designated number of measurement points. In this case, five chips within the shot are selected, and measurement points m1 to m5 are set within the respective chips.

As is apparent from FIGS. 14 and 15, the measurement points m1 to m5 fall within respective chips, and are used to measure identical locations free from the influence of the corrugation 102. Surface levels measured at the measured points m1 to m5 can be regarded to be equal. In th third embodiment, measurement points within chips are located at the identical positions. When portions other than the corrugations on the chips can be regarded to be flush with each other, the measurement points can be set to these portions. In this case, if each measurement position is decentered from the shot center, as shown in FIG. 14, the measurement points m2 to m5 are radially arranged from the shot center, which can decrease the decentering amount.

The measurement point within the shot has the maximum span which can be selected within the shot. The inclination detection precision can be increased in accordance with the relationship of the measurement point distance with respect to measurement variations.

FIG. 16 shows an example in which four measurement points are set at the boundary between chips within the shot. In the above example, measurement points are set within chips. In this example, measurement points are set at the boundary between chips, i.e., on the scribing lines between chips. Measuring the chip boundary allows selecting measurement points which are hardly decentered within the shot without any influence corrugations.

Figure 17:
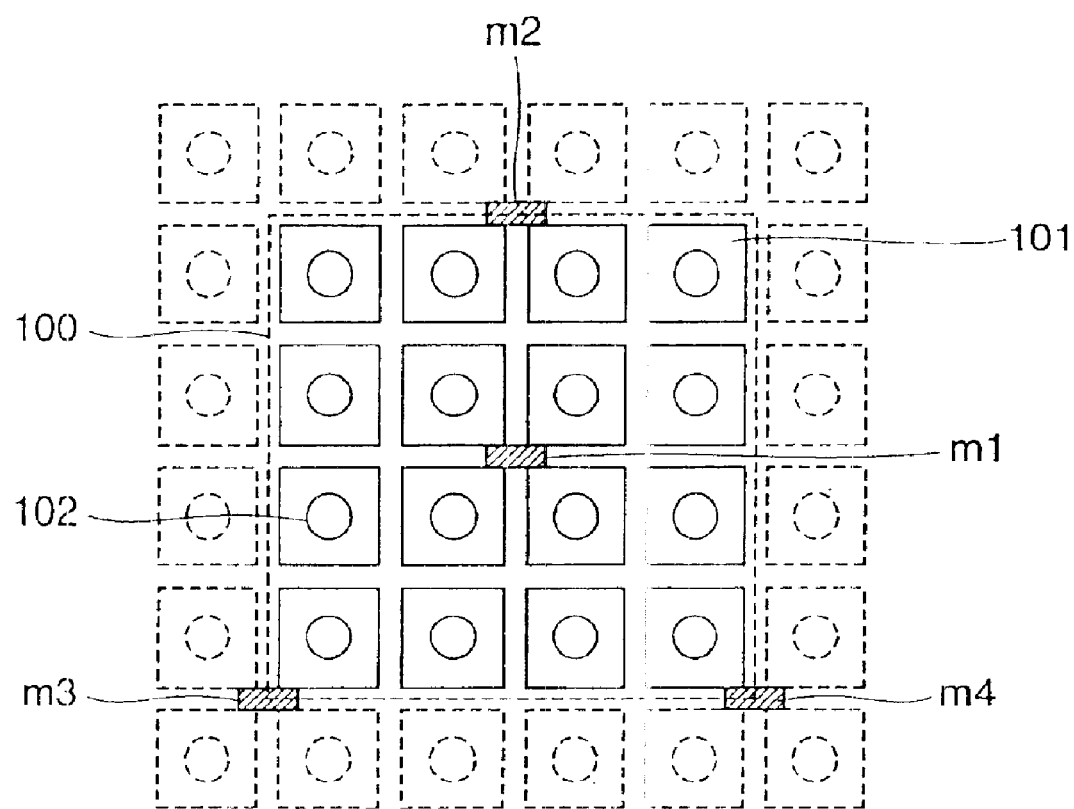
FIG. 17 is a plan view showing Example 4 of the measurement (detection) point according to the present invention.

FIG. 17 shows an example in which measurement points are set outside the shot. Chips represented by broken lines outside the shot 100 represent some of shots adjacent to the shot 100. The measurement points m1 to m4 are arranged on scribing lines between the shot 100 and adjacent shots. This can widen the measurement span and increase the inclination detection precision.

When the coordinate position between chips is to be calculated, the coordinate position of a chip in a shot adjacent to the target shot is also calculated as a measurement candidate. If the shot size is small, the chip of the adjacent shot can be selected as a measurement point. The measurement span can be widened, and the inclination detection precision of the shot can be ensured.

Figure 21:
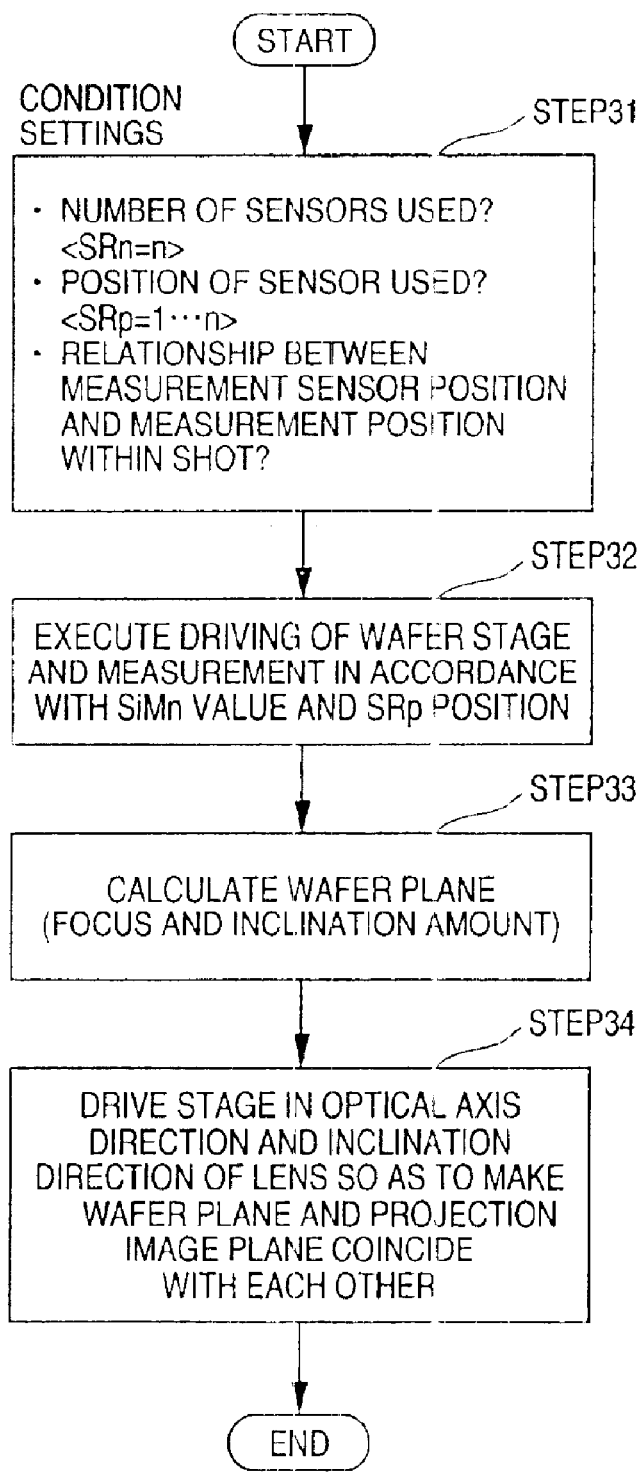
FIG. 21 is a flow chart showing a measurement example within a shot according to the present invention.

Selection of measurement points within a shot has been described. A measurement method using the sensor of the plane alignment apparatus for measurement points selected within a shot will be explained. FIG. 21 shows the flow of this method.

In step 31, conditions for designating a sensor to be used in the plane alignment apparatus, and determining measurement points to be measured by the sensor are set. In this example, five measurement sensors 51 to 55 are assumed to be set within a region to be exposed, as shown in FIG. 9.

Figure 18A:
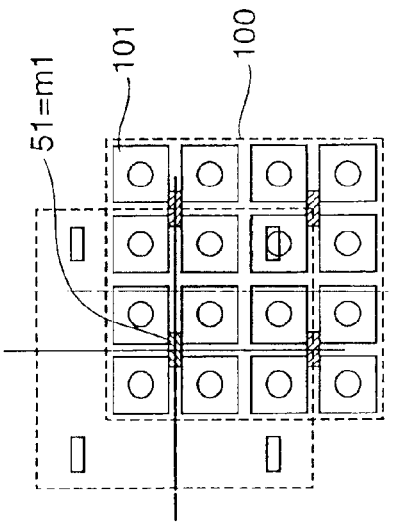
Figure 18B:
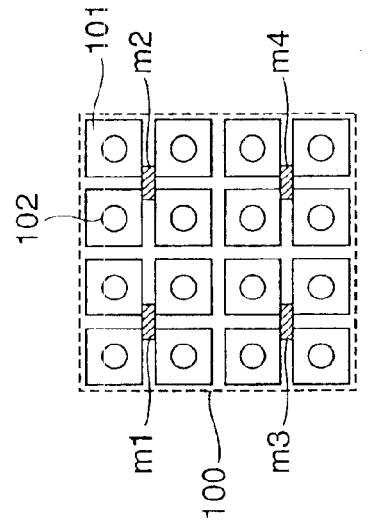

FIGS. 18A to 18F show an example in which one sensor 51 (FIG. 18A) of the plane alignment apparatus is used to measure four measurement points m1 to m4 (FIG. 18B) within a shot. FIG. 18A shows the layout of the detection sensors 51 to 55 within the region 100 to be exposed. In this example, one sensor 51 is designated and measures the four measurement points m1 to m4 in FIG. 11B.

Figure 18C:
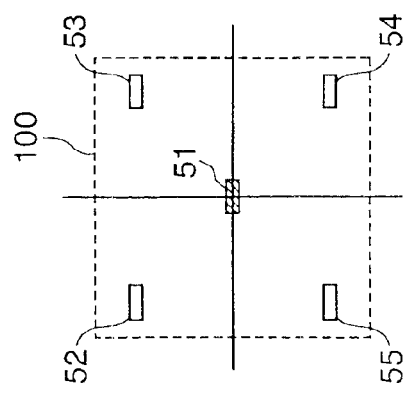
Figure 18D:
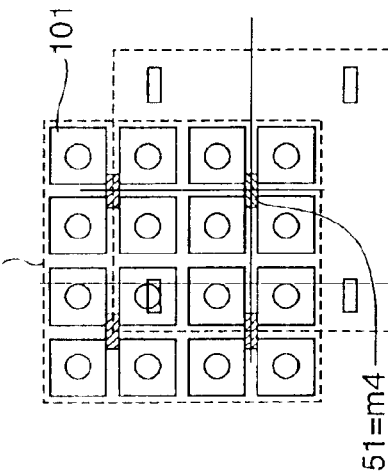
Figure 18E:
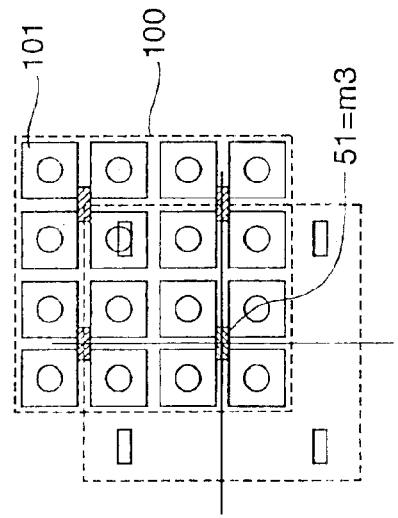

In step 32, as shown in FIG. 18C, the wafer stage 7, which holds the wafer 5 shown in FIG. 8, is driven to a position where the measurement point m1 coincides with the sensor 51 of the plane alignment apparatus. Then, the surface level of the wafer is measured.

Figure 18F:
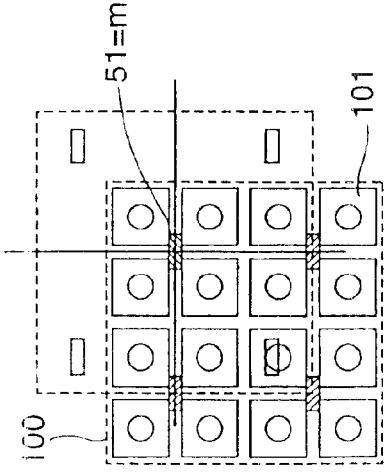

By the same procedure, the wafer stage 7 is driven such that the sensor 51 coincides with the measurement point m2 (FIG. 18D), the measurement point m3 (FIG. 18E), and the measurement point m4 (FIG. 18F). The surface level of the wafer 5 is measured to acquire surface level data at m1 to m4.

In step 33, the plane (focus and inclination amount) of the wafer 5 is calculated from these acquired surface level data. In step 34, the wafer stage 7 is driven in the optical axis direction and inclination direction of the lens such that a plane defined by three points in three-point measurement, or the least square plane calculated in measurement at four points or more is made to coincide with the image plane of the projection optical system 4. Thereafter, exposure is done to transfer the image of the reticle 2 onto the wafer 5.

Figure 19A:
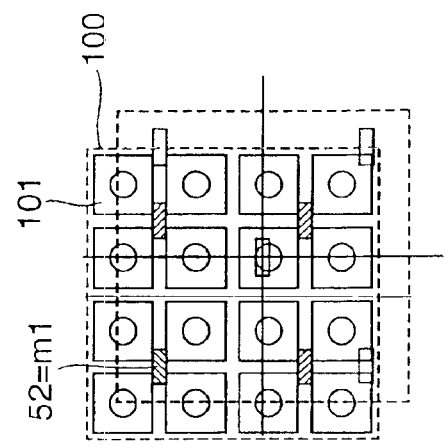
Figure 19B:
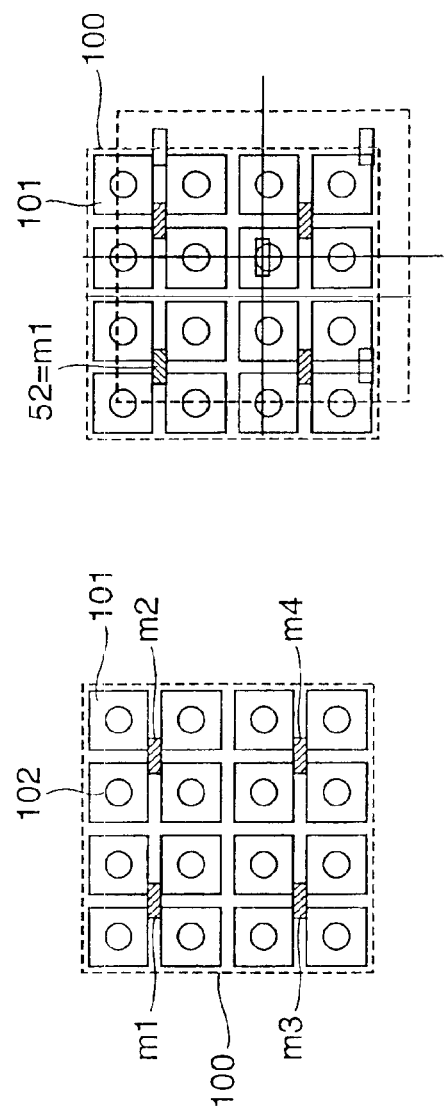

FIGS. 19A to 19F show an example in which four sensors 52 to 55 (FIG. 19A) are used as the sensors of the plane alignment apparatus and measure four measurement points m1 to m4 (FIG. 19B) within the shot. FIG. 19A shows the layout of the detection sensors 51 to 55 within the region 100 to be exposed. In this example, the four sensors 52 to 55 are designated and measure the four measurement points m1 to m4 in FIG. 19B. The relationship between the sensors and measurement points is input in advance, as described above. The measurement point of the sensor 52 is designated as m1; that of the sensor 53, as m2; that of the sensor 54, as m3; and that of the sensor 55, as m4.

Figure 19C:
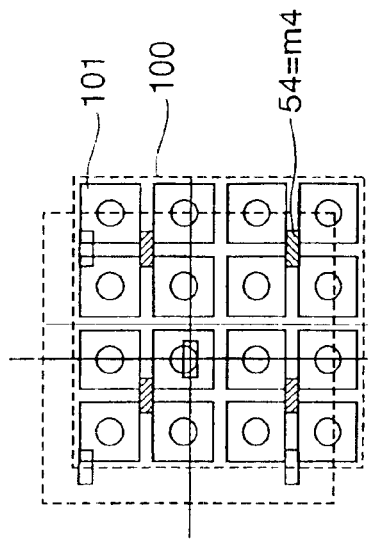
Figure 19D:
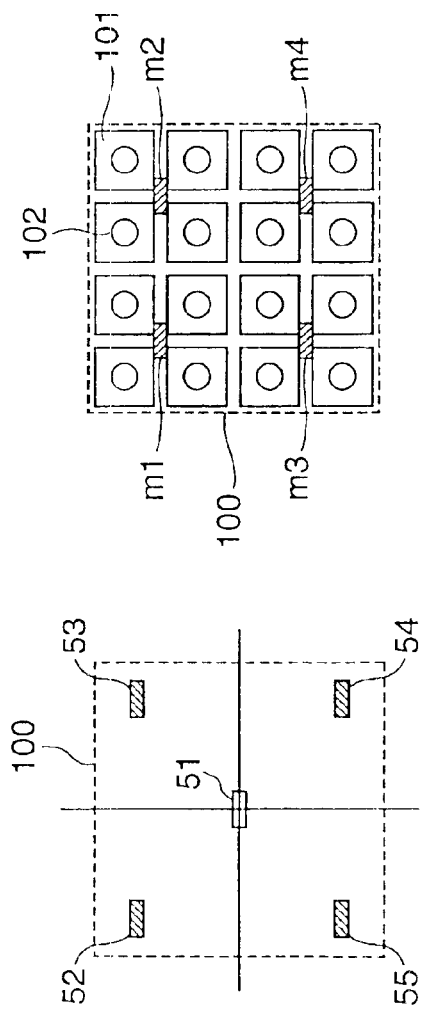
Figure 19E:
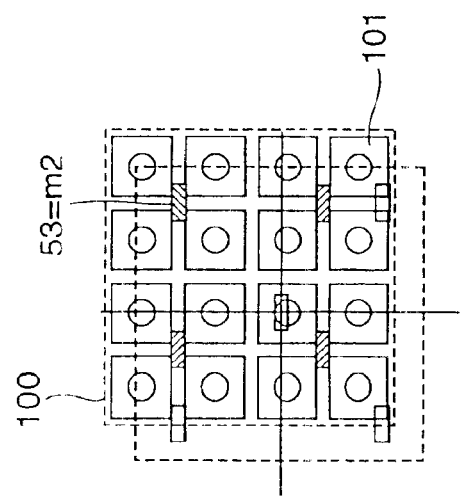

As shown in FIG. 19C, the wafer stage 7, which holds the wafer 5 shown in FIG. 8, is driven to a position where the measurement point m1 coincides with the sensor 52 of the plane alignment apparatus. Then, the surface level of the wafer is measured.

Figure 19F:
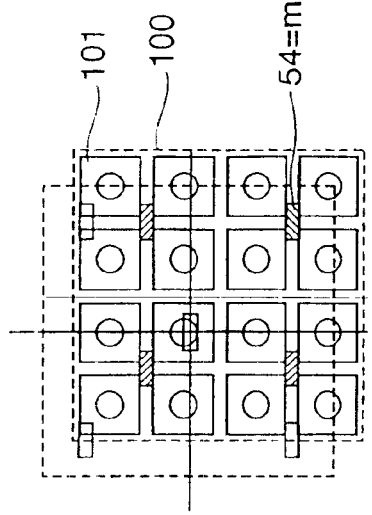

By the same procedure, the wafer stage 7 is driven such that the sensor 53 coincides with the measurement point m2 (FIG. 19D), the sensor 55 coincides with the measurement point m3 (FIG. 19E), and the sensor 54 coincides with the measurement point m4 (FIG. 19F). The surface level of the wafer 5 is measured to acquire surface level data at m1 to m4. The subsequent processing is the same as that shown in FIGS. 18A to 18F.

The difference between the arrangements FIGS. 18A to 18F and FIGS. 19A to 19F is the number of sensors. Plane alignment measurement ideally uses one surface level detection sensor, because any error such as the difference in measurement value between sensors does not occur. In terms of the plane position measurement time, sensors closer to measurement points are preferably used to shorten the wafer moving distance.

(Embodiment of A Semiconductor Production System)

A production system for a semiconductor device (e.g., a semiconductor chip such as an IC or LSI, liquid crystal panel, CCD, thin-film magnetic head, micromachine, or the like) using the apparatus or method according to the present invention will be exemplified. A trouble remedy or periodic maintenance of a manufacturing apparatus installed in a semiconductor manufacturing factory, or maintenance service such as software distribution is performed by using a computer network outside the manufacturing factory.

Figure 22:
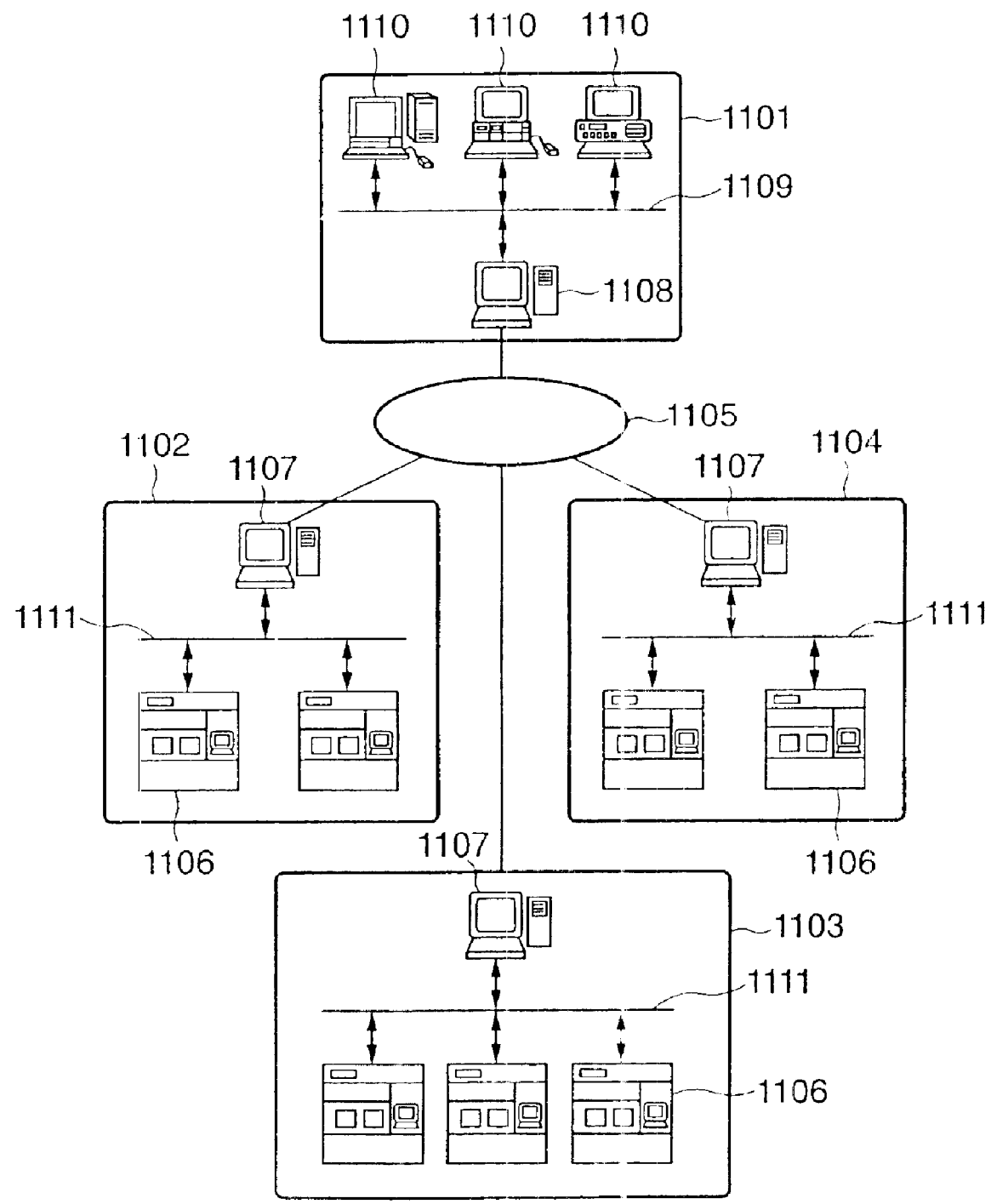
FIG. 22 is a view showing the concept of a semiconductor device production system using the apparatus according to the present invention when viewed from a given angle.

FIG. 22 shows the overall system cut out at a given angle. In FIG. 22, reference numeral 1101 denotes a business office of a vendor (apparatus supply manufacturer) which provides a semiconductor device manufacturing apparatus. Examples of the manufacturing apparatus are semiconductor manufacturing apparatuses for performing various processes used in a semiconductor manufacturing factory, such as pre-process apparatuses (e.g., lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 1101 comprises a host management system 1108 for providing a maintenance database for the manufacturing apparatus, a plurality of operation terminal computers 1110, and a LAN (Local Area Network) 1109, which connects the host management system 1008 and computers 1110 to build an intranet. The host management system 1108 has a gateway for connecting the LAN 1109 to Internet 1105 serving as an external network of the business office, and a security function for limiting external access.

Reference numerals 1102 to 1104 denote manufacturing factories of the semiconductor manufacturer as users of manufacturing apparatuses. The manufacturing factories 1102 to 1104 may belong to different manufacturers or the same manufacturer (e.g., a pre-process factory, a post-process factory, and the like). Each of the factories 1102 to 1104 is equipped with a plurality of manufacturing apparatuses 1106, a LAN (Local Area Network) 1111, which connects these apparatuses 1106 to construct an intranet, and a host management system 1107 serving as a monitoring apparatus for monitoring the operation status of each manufacturing apparatus 1106. The host management system 1107 in each of the factories 1102 to 1104 has a gateway for connecting the LAN 11111 in the factory to the Internet 1105 serving as an external network of the factory. Each factory can access the host management system 1108 of the vendor 1101 from the LAN 1111 via the Internet 1105. The security function of the host management system 1108 authorizes access of only a limited user. More specifically, the factory can notify the vendor via the Internet 1105 of status information (e.g., the symptom of a manufacturing apparatus in trouble) representing the operation status of each manufacturing apparatus 1106. Also, the factory can receive, from the vendor, response information (e.g., information designating a remedy against the trouble, or remedy software or data) corresponding to the notification, or maintenance information such as the latest software or help information. Data communication between the factories 1102 to 1104 and the vendor 1101 and data communication protocol (TCP/IP) generally used in the Internet. Instead of using the Internet as an external network of the factory, a high-security dedicated network (e.g., an ISDN), which inhibits access of a third party, can be adopted. Also, the user may construct a database in addition to the one provided by the vendor and set the database on an external network, and the host management system may authorize access to the database from a plurality of user factories.

Figure 23:
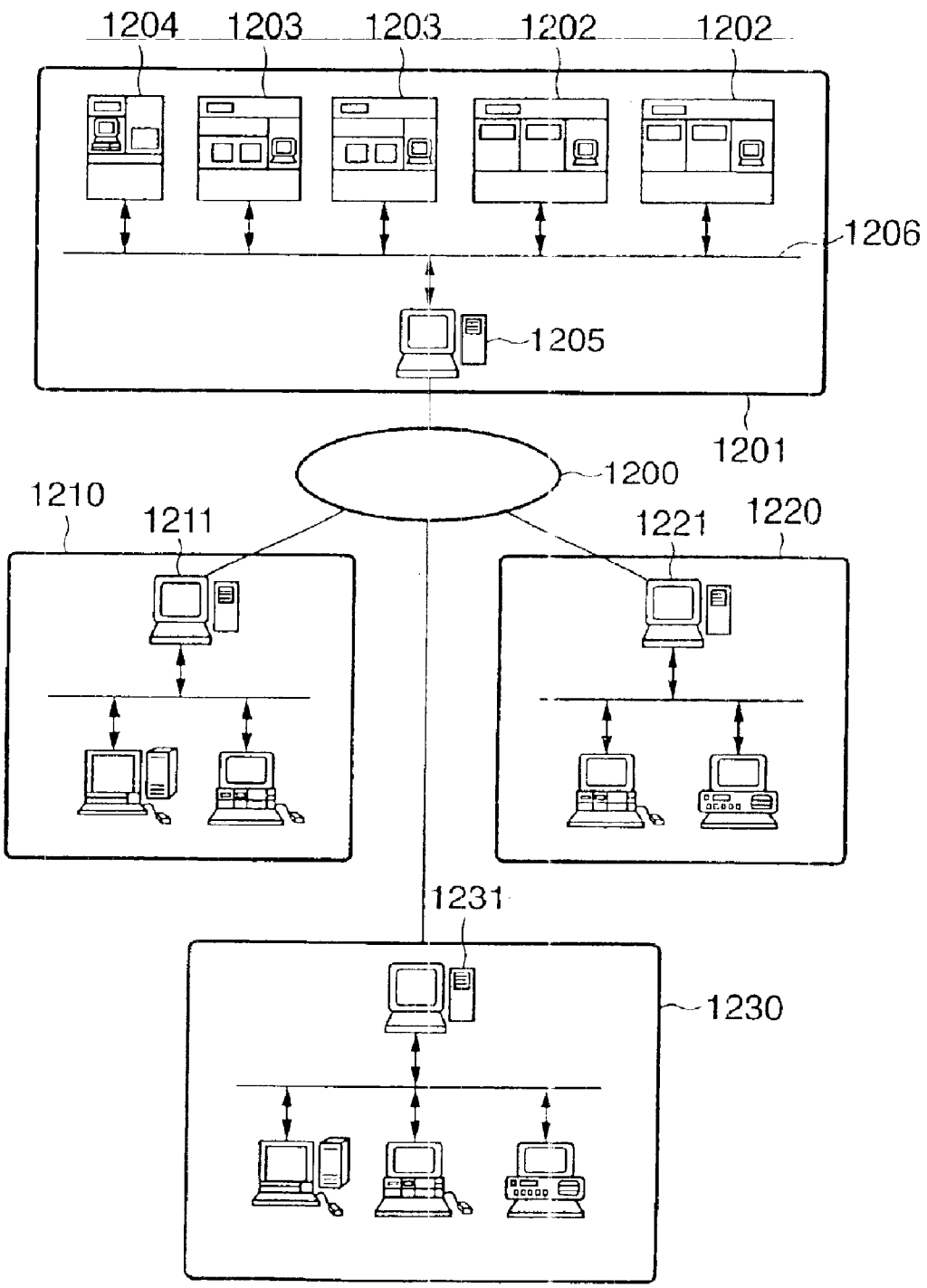
FIG. 23 is a view showing the concept of the semiconductor device production system using the apparatus according to the present invention when viewed from another angle.

FIG. 23 is a view showing concept of the overall system of this embodiment that is cut out at a different angle from FIG. 22. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 23, a factory having manufacturing apparatuses of a plurality of vendors and the management system fo the vendors for these manufacturing apparatuses are connected via the external network of the factory, and maintenance information of each manufacturing apparatus is communicated. In FIG. 23, reference numeral 1201 denotes a manufacturing factory of a manufacturing apparatus user (e.g., a semiconductor device manufacturer) where manufacturing apparatuses for performing various processes, e.g., an exposure apparatus 1202, a resist processing apparatus 1203, and a film formation apparatus 1204 are installed in the manufacturing line of the factory. FIG. 23 shows only one manufacturing factory 1201, but a plurality of factories are networked in practice. The respective apparatuses in the factory are connected to a LAN 1206 to build n intranet, and a host management system 1205 manages the operation of the manufacturing line.

The business offices of vendors (e.g., apparatus supply manufacturers), such as an exposure apparatus manufacturer 1210, a resist processing apparatus manufacturer 1220, and a film formation apparatus manufacturer 1230 comprise host management systems 1211, 1221, and 1231 for executing remote maintenance for the supplied apparatuses. Each host management system has a maintenance database and a gateway for an external network, as described above. The host management system 1205 for managing the apparatuses in the manufacturing factory of the user, and the management systems 1211, 1221, and 1231 of the vendors for the respective apparatuses are connected via the Internet or dedicated network serving as an external network 1200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 1200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, hard disk, or network file server. The network access software includes a dedicated or general-purpose web browser, and provides a user interface having a window, as shown in FIG. 24, on the display. While referring to this window, the operator who manages manufacturing apparatuses in each factory inputs, in input items on the windows, pieces of information such as the type of manufacturing apparatus 1401, serial number 1402, subject of trouble 1403, occurrence date 1404, degree of urgency 1405, symptom 1406, remedy 1407, and progress 1408. The pieces of input information are transmitted to the maintenance database via the Internet, and appropriate maintenance information is sent back from the maintenance database and displayed on the display. The user interface provided by the web browser realizes hyperlink functions (1410 to 1412), as shown in FIG. 24. This allows the operator to access detailed information of each item, receive the latest-version software to be used for a manufacturing apparatus from a software library provided by a vendor, and receive an operation guide (help information) as a reference for the operator in the factory.

The maintenance information provided by the maintenance database also includes information about the present invention described above. The software library also provides the latest-version software for implementing the present invention.

Figure 25:
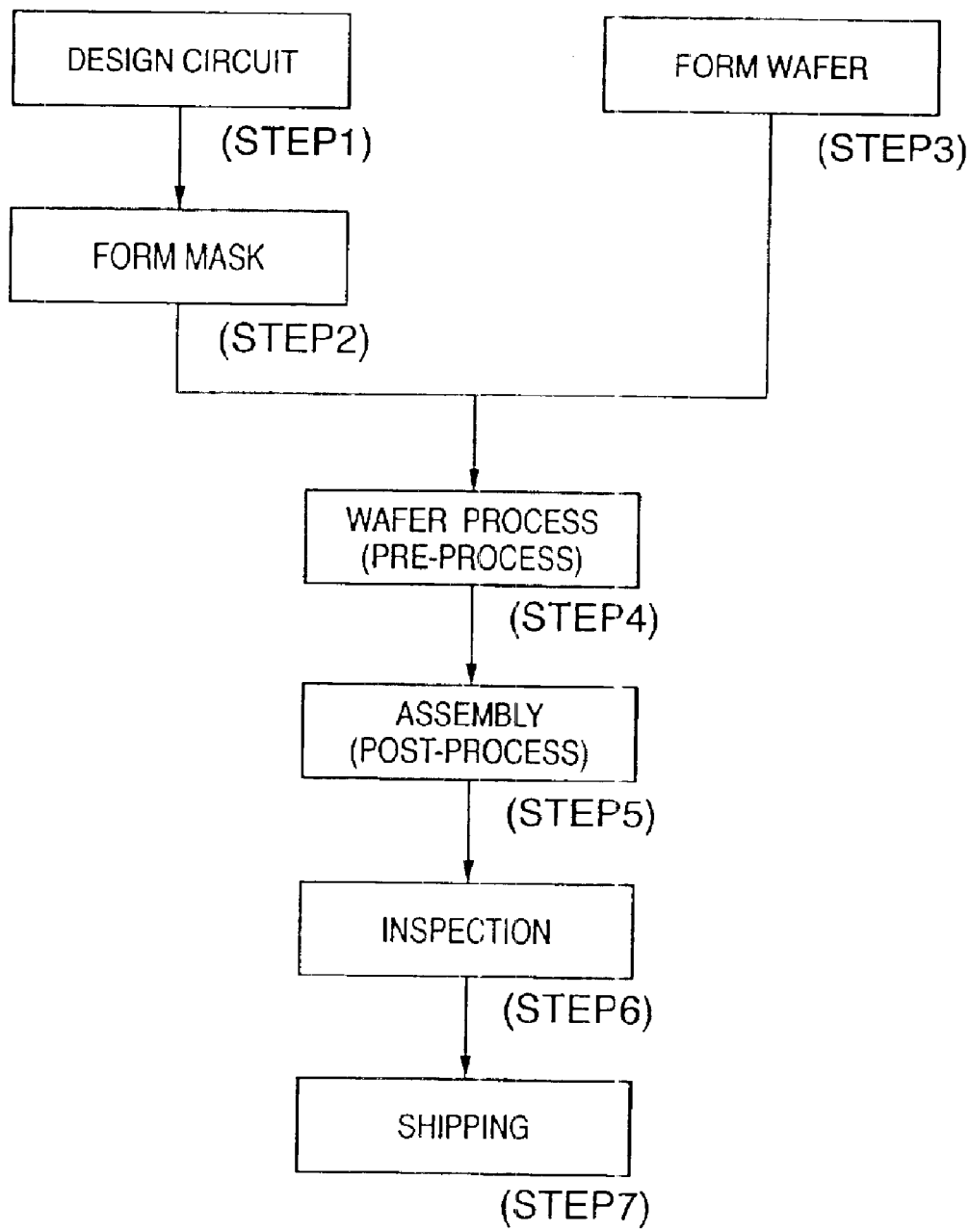
FIG. 25 is a flow chart for explaining the flow of a device manufacturing process.

A semiconductor device manufacturing process using the above-described production system will be explained. FIG. 25 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7). The pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 26:
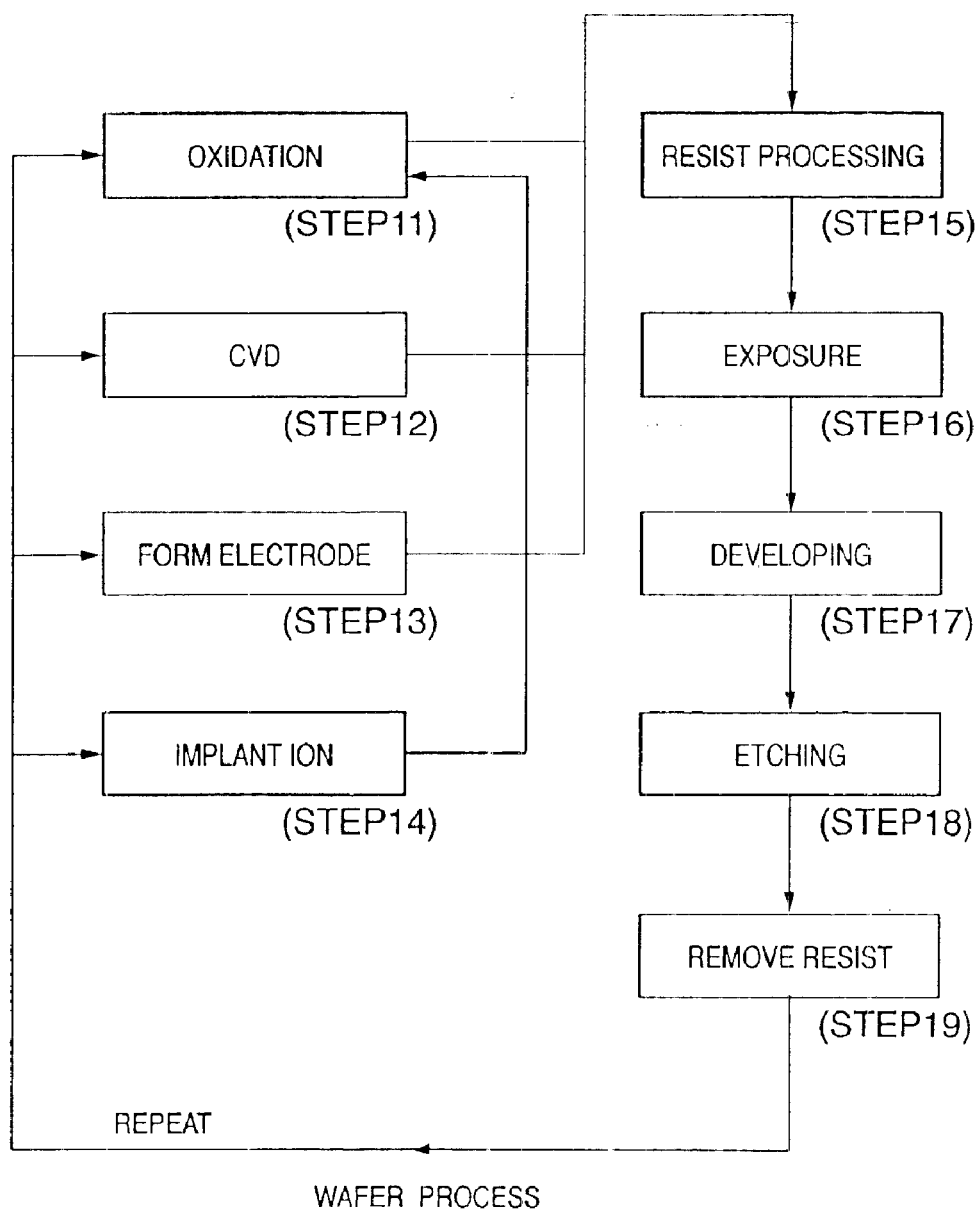
FIG. 26 is a flow chart for explaining a wafer process.

FIG. 26 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask, and prints the circuit pattern on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, the present invention determines focus measurement points on the basis of transfer information of an underlayer, or the like, before a substrate is exposed. The present invention can increase the focus precision and the leveling precision.

The present invention can stably detect the surface level of a corrugated substrate. The present invention can increase the plane alignment precision, can transfer a pattern with high precision, and can form a circuit with a higher degree of integration.

As many apparently widely different embodiments of the present invention can be made without departing from the spirit and scope thereof, it is to be understood that the invention is not limited to the specific embodiments thereof except as defined in the claims.

What is claimed is:

1. An exposure method of projecting a pattern of an original onto a substrate through a projection optical system by detecting a surface position of the substrate, in a direction of an optical axis of the projection optical system, by a detection unit, said method comprising the steps of:

determining a point, on the surface of the substrate, with respect to which the detection unit detects the surface position, based on information of a layout of a pattern previously formed on the substrate and a layout of a pattern to be projected onto the substrate; and detecting a surface position of the substrate using the detection unit with respect to the point determined in said determining step.

2. A method according to claim 1, wherein in said detecting step, the substrate is moved in a direction perpendicular to the optical axis based on the point determined in said determining step.

3. A method according to claim 1, further comprising a step of moving the substrate in a direction parallel to the optical axis based on the surface position detected in said detecting step.

4. A method according to claim 1, wherein the information of the layout of the pattern previously formed includes information of at least one of a field size and a layout of an exposure previously performed for the substrate.

5. A method according to claim 1, wherein the information of the layout of the pattern to be projected includes information of at least one of a field size and a layout of an exposure to be performed for the substrate.

6. A method according to claim 1, further comprising a step of obtaining an offset, with respect to the point determined in said determining step, used for offsetting the position detected in said detecting step.

7. A method according to claim 1, wherein the point is determined within a region where a region exposed at a previous shot and a region to be exposed at a subsequent shot overlay each other.

8. A method according to claim 1, wherein a field size of an exposure to be performed for the pattern to be projected is different from a field size of an exposure having been performed for the pattern previously formed.

9. A method according to claim 1, wherein a field size of an exposure to be performed for the pattern to be projected is larger than a field size of an exposure having been performed for the pattern previously formed.

10. An exposure apparatus comprising:

a projection optical system which projects a pattern of an original onto a substrate;

a detection system which detects a surface position of the substrate in a direction of an optical axis of said projection optical system; and a determination system which determines a point on the surface of the substrate, with respect to which said detection system detects the surface position, based on information of a layout of a pattern previously formed on the substrate and a layout of a pattern to be projected onto the substrate.

11. An apparatus according to claim 10, wherein a field size of an exposure to be performed for the pattern to be projected is different from a field size of an exposure having been performed for the pattern previously formed.

12. An apparatus according to claim 10, wherein a field size of an exposure to be performed for the pattern to be projected is larger than a field size of an exposure having been performed for the pattern previously formed.

13. A device manufacturing method comprising steps of:

exposing a substrate to a pattern using an exposure apparatus; and developing the exposed substrate, wherein the exposure apparatus comprises:

a projection optical system which projects a pattern of an original onto a substrate;

a detection system which detects a surface position of the substrate in a direction of an optical axis of said projection optical system; and a determination system which determines a point on the surface of the substrate, with respect to which said detection system detects the surface position, based on information of a layout of a pattern previously formed on the substrate and a layout of a pattern to be projected onto the substrate.

14. A device manufactured by a device manufacturing method as recited in claim 13.

* * * * *

UNITED STATES PATENT AND TRADEMARK OFFICE
CERTIFICATE OF CORRECTION

PATENT NO. : 6,876,435 B2
DATED : April 5, 2005
INVENTOR(S) : Yoshiharu Kataoka et al.

It is certified that error appears in the above-identified patent and that said Letters Patent is hereby corrected as shown below:

<u>Title page,</u>
Item [56], References Cited, U.S. PATENT DOCUMENTS, insert the following in numerical order:
-- 5,118,957 A   6/1992  Kawashima et al. ………………….250/561 --.

<u>Column 8,</u>
Line 42, "statistics" should read -- statistical --.

<u>Column 12,</u>
Line 24, "determined" should read -- determine --.

<u>Column 13,</u>
Line 24, "th" should read -- the --.

<u>Column 16,</u>
Line 8, "fo" should read -- of --.
Line 20, "n" should read -- an --.

Signed and Sealed this

Fourth Day of October , 2005

JON W. DUDAS
*Director of the United States Patent and Trademark Office*